US009609760B2

(12) United States Patent
Saeki et al.

(10) Patent No.: US 9,609,760 B2
(45) Date of Patent: Mar. 28, 2017

(54) ELECTRONIC COMPONENT MOUNTING METHOD

(75) Inventors: Tsubasa Saeki, Osaka (JP); Yoshiyuki Wada, Osaka (JP); Koji Motomura, Osaka (JP); Tadahiko Sakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 341 days.

(21) Appl. No.: 14/119,832

(22) PCT Filed: Jun. 1, 2012

(86) PCT No.: PCT/JP2012/003626
§ 371 (c)(1),
(2), (4) Date: Nov. 22, 2013

(87) PCT Pub. No.: WO2012/164957
PCT Pub. Date: Dec. 6, 2012

(65) Prior Publication Data
US 2014/0096379 A1    Apr. 10, 2014

(30) Foreign Application Priority Data
Jun. 2, 2011    (JP) ................. 2011-124483

(51) Int. Cl.
*H05K 3/30* (2006.01)
*H01L 23/00* (2006.01)
(Continued)

(52) U.S. Cl.
CPC ............. *H05K 3/305* (2013.01); *H01L 24/73* (2013.01); *H01L 24/81* (2013.01); *H01L 24/83* (2013.01);
(Continued)

(58) Field of Classification Search
CPC ......... H01L 24/81; H01L 24/13; H01L 24/16; H01L 24/29; H01L 24/32; H01L 24/73;
(Continued)

(56) References Cited

U.S. PATENT DOCUMENTS 4,419,146 A * 12/1983 Roberts ................ H05K 3/3489
148/23
4,604,644 A    8/1986 Beckham et al.
(Continued)

FOREIGN PATENT DOCUMENTS

JP    05-283475 A    10/1983
JP    S61-177738 A    8/1986
(Continued)

OTHER PUBLICATIONS

International Search Report issued in International Application No. PCT/JP2012/003626 with Date of mailing Jul. 10, 2012 with English Translation.
(Continued)

*Primary Examiner* — A. Dexter Tugbang
(74) *Attorney, Agent, or Firm* — McDermott Will & Emery LLP

(57) ABSTRACT

An electronic component mounting method including the steps of: providing a first electronic component having a principal surface provided with a plurality of bumps; providing a substrate having a placement area provided with a plurality of first electrodes corresponding to the plurality of bumps; applying flux to the plurality of bumps; applying flux to at least one of the first electrodes adjacent to at least one reinforcement position set on a peripheral portion of the placement area; dispensing a thermosetting resin onto the reinforcement position, and at least partially coating the first electrode adjacent to the reinforcement position, with the thermosetting resin; placing the first electronic component
(Continued)

on the substrate such that the bumps land on the corresponding first electrodes, and thus bringing the thermosetting resin into contact with a peripheral edge portion of the first electronic component; and heating the substrate with the first electronic component placed thereon.

8 Claims, 17 Drawing Sheets

(51) Int. Cl.
 *H05K 3/34* (2006.01)
 *H05K 13/04* (2006.01)
(52) U.S. Cl.
 CPC .............. *H01L 24/92* (2013.01); *H05K 3/34* (2013.01); *H05K 3/3405* (2013.01); *H05K 3/3436* (2013.01); *H05K 3/3468* (2013.01); *H05K 3/3484* (2013.01); *H05K 3/3489* (2013.01); *H05K 3/3494* (2013.01); *H05K 13/0465* (2013.01); *H01L 24/13* (2013.01); *H01L 24/16* (2013.01); *H01L 24/29* (2013.01); *H01L 24/32* (2013.01); *H01L 24/75* (2013.01); *H01L 2224/11822* (2013.01); *H01L 2224/131* (2013.01); *H01L 2224/16225* (2013.01); *H01L 2224/16265* (2013.01); *H01L 2224/29012* (2013.01); *H01L 2224/2919* (2013.01); *H01L 2224/30155* (2013.01); *H01L 2224/32225* (2013.01); *H01L 2224/73103* (2013.01); *H01L 2224/73104* (2013.01); *H01L 2224/73203* (2013.01); *H01L 2224/73204* (2013.01); *H01L 2224/7501* (2013.01); *H01L 2224/7515* (2013.01); *H01L 2224/75611* (2013.01); *H01L 2224/75821* (2013.01); *H01L 2224/8102* (2013.01); *H01L 2224/81011* (2013.01); *H01L 2224/81024* (2013.01); *H01L 2224/81143* (2013.01); *H01L 2224/81193* (2013.01); *H01L 2224/81815* (2013.01); *H01L 2224/81903* (2013.01); *H01L 2224/8385* (2013.01); *H01L 2224/83104* (2013.01); *H01L 2224/83192* (2013.01); *H01L 2224/83194* (2013.01); *H01L 2224/83862* (2013.01); *H01L 2224/9211* (2013.01); *H01L 2924/19105* (2013.01); *H01L 2924/351* (2013.01); *H05K 2201/10977* (2013.01); *Y02P 70/613* (2015.11); *Y10T 29/4913* (2015.01); *Y10T 29/49144* (2015.01); *Y10T 29/49146* (2015.01); *Y10T 29/49149* (2015.01); *Y10T 29/49179* (2015.01); *Y10T 29/53174* (2015.01)
(58) Field of Classification Search
 CPC ......... H01L 24/75; H01L 24/83; H01L 24/92; H01L 2924/351; H01L 2224/10977; H01L 2224/11822; H01L 2224/16225; H01L 2224/19105; H01L 2224/131; H01L 2224/2919; H01L 2224/351; H01L 2224/81903; H01L 2224/9211; H01L 2224/8385; H01L 2201/10977; H01L 2224/16265; H01L 2224/29012; H01L 2224/30155; H01L 2224/32225; H01L 2224/73204; H01L 2224/73203; H01L 2224/73103; H01L 2224/7515; H01L 2224/75821; H01L 2224/75611; H01L 2224/81011; H01L 2224/8102; H01L 2224/81143; H01L 2224/81815; H01L 2224/83194; H01L 2224/7501; H01L 2224/81204; H01L 2224/81193; H01L 2224/83192; H01L 2224/83862; H01L 2224/83104; H01L 2224/73104; H01L 2224/81; H01L 2924/00; H01L 2924/00012; H01L 2924/00014; H05K 13/0465; H05K 3/305; H05K 3/34; H05K 3/3405; H05K 3/3436; H05K 3/3468; H05K 3/3484; H05K 3/3489; H05K 3/3494; Y02P 70/613; Y10T 29/4913; Y10T 29/49144; Y10T 29/49146; Y10T 29/49149; Y10T 29/49179; Y10T 29/53174
See application file for complete search history.

(56) References Cited

U.S. PATENT DOCUMENTS

| | | | | |
|---|---|---|---|---|
| 5,686,226 | A * | 11/1997 | Groman | ............... H05K 3/3484 228/35 |
| 6,978,540 | B2 | 12/2005 | Morganelli et al. | |
| 7,213,739 | B2 | 5/2007 | Wilson et al. | |
| 2002/0162679 | A1 | 11/2002 | Hannan et al. | |
| 2003/0001286 | A1* | 1/2003 | Kajiwara | ................ H01L 24/81 257/778 |
| 2003/0096452 | A1 | 5/2003 | Yin et al. | |
| 2003/0096453 | A1 | 5/2003 | Wang et al. | |
| 2005/0224560 | A1* | 10/2005 | Takesue | ............... H05K 3/3489 228/180.22 |
| 2006/0246695 | A1* | 11/2006 | Kim | ..................... H05K 3/3484 438/584 |
| 2008/0110016 | A1* | 5/2008 | Card | ..................... H05K 3/3484 29/830 |
| 2009/0127321 | A1* | 5/2009 | Gottshall | ............. H05K 3/3468 228/264 |
| 2010/0101845 | A1 | 4/2010 | Kishi et al. | |
| 2010/0105173 | A1* | 4/2010 | Fujimori | .............. H05K 3/3436 438/121 |
| 2010/0295177 | A1* | 11/2010 | Ouchi | .................. H05K 3/3436 257/737 |

FOREIGN PATENT DOCUMENTS

| | | | |
|---|---|---|---|
| JP | H08-266980 | A | 10/1996 |
| JP | 2002-334906 | A | 11/2002 |
| JP | 2003-218508 | A | 7/2003 |
| JP | 2005-502187 | A | 1/2005 |
| JP | 2006-073976 | A | 3/2006 |
| JP | 2007128982 | A * | 5/2007 |
| JP | 2010-212655 | A | 9/2010 |
| WO | 03/044848 | A1 | 5/2003 |
| WO | 03/044849 | A2 | 5/2003 |

OTHER PUBLICATIONS

Office Action issued in corresponding Japanese Patent Application No. 2013-517890, mailed on May 10, 2016.

* cited by examiner

F I G. 1
(a)
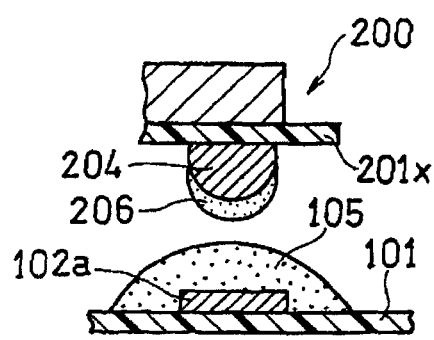
(b)
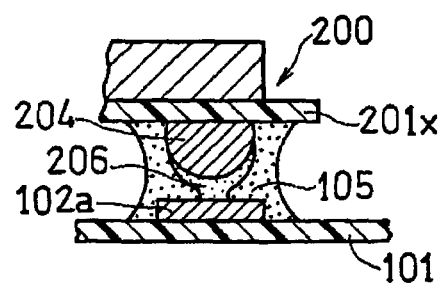
(c)
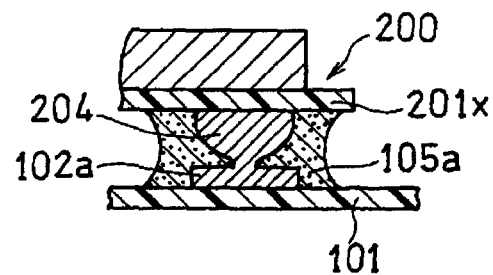

FIG. 2
(a) 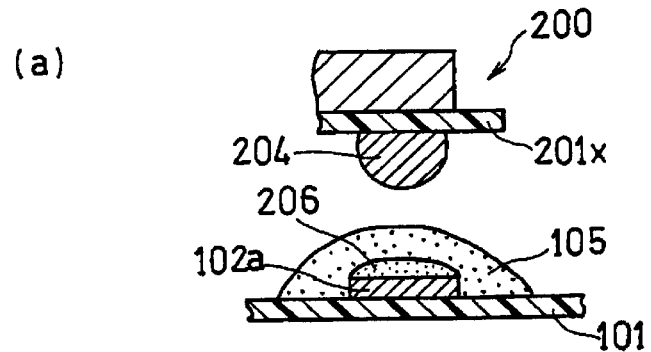
(b) 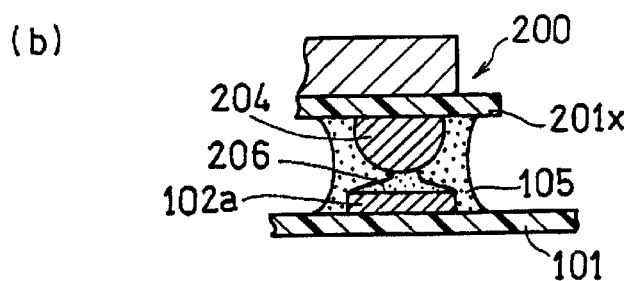
(c) 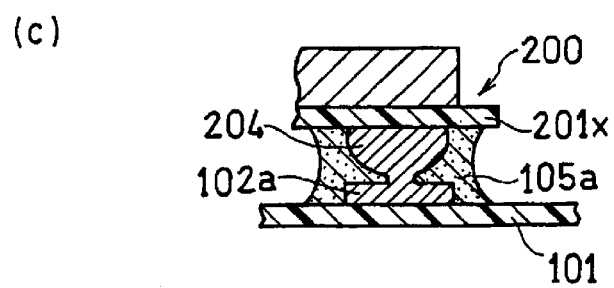

FIG. 6
(a)
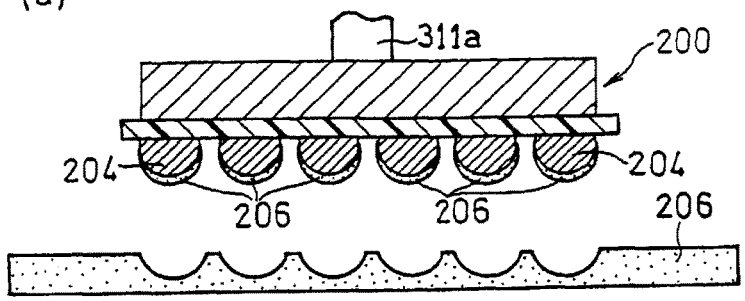
(b)
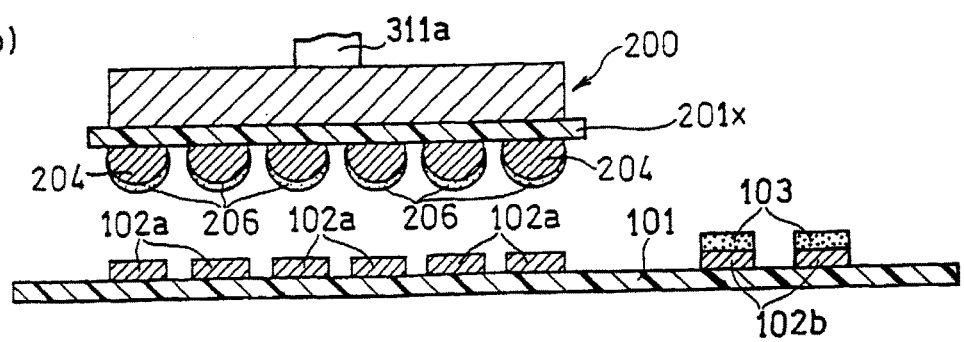
(c)
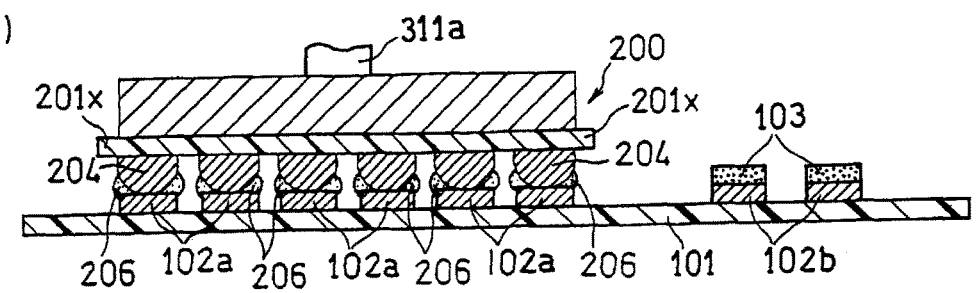
(d)
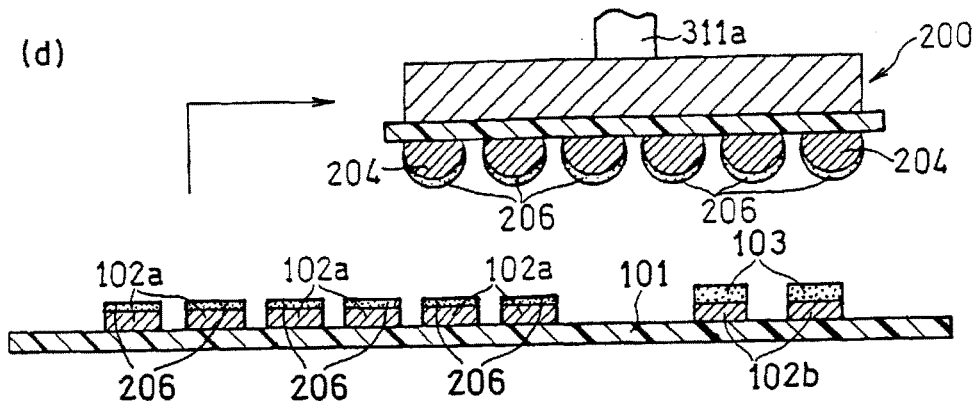

FIG. 7
(a)
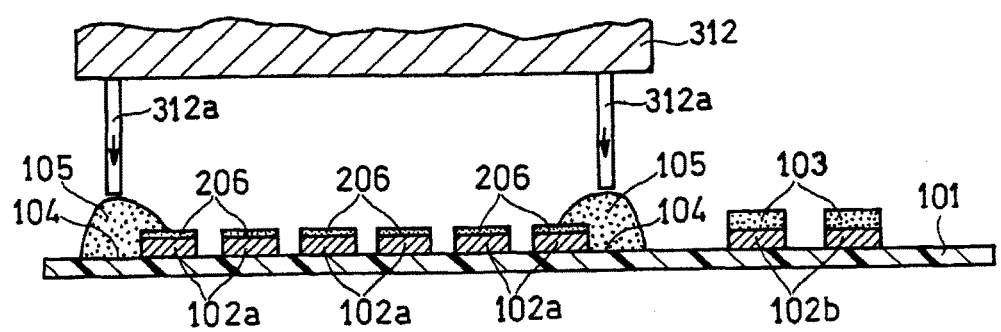
(b)
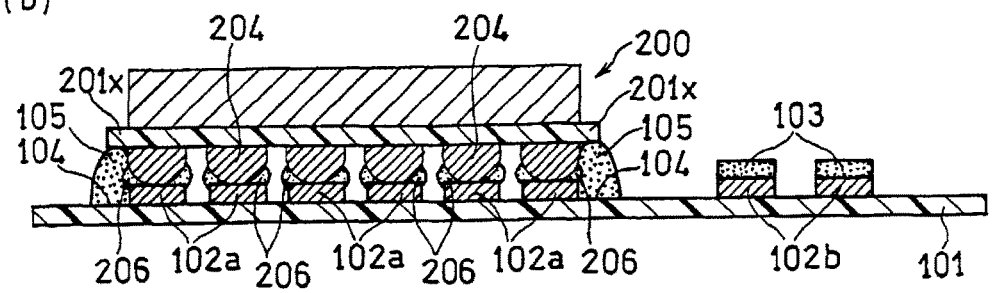
(c)
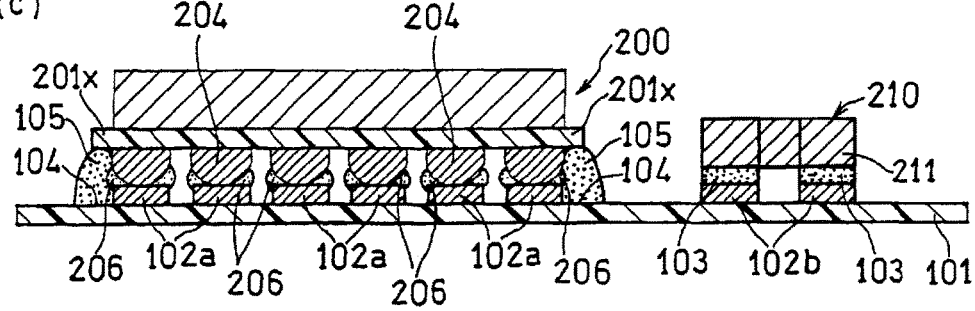

FIG. 8
(a) 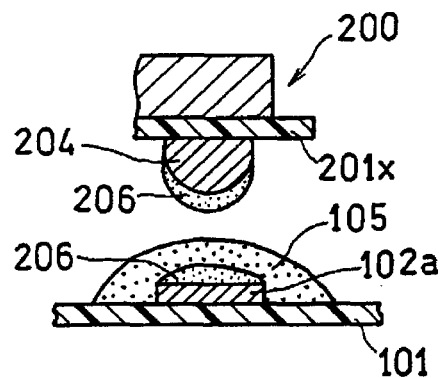
(b) 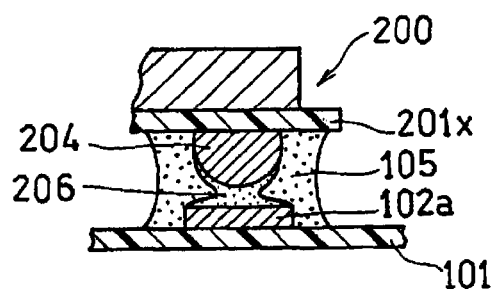
(c) 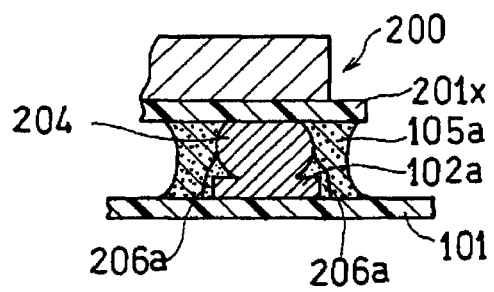

FIG. 9
(a)
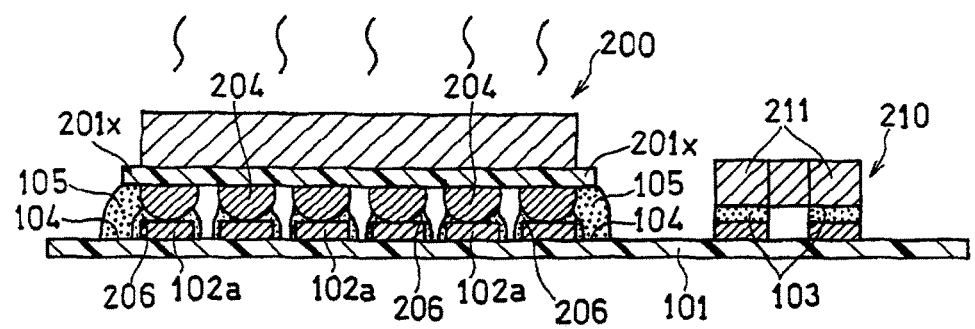
(b)
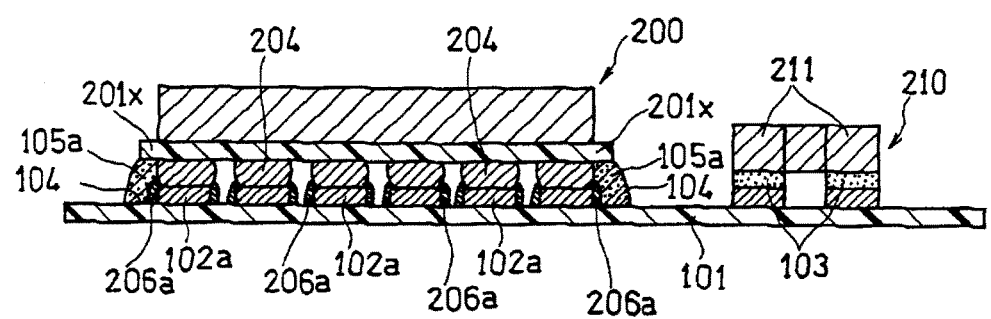

F I G. 1 4
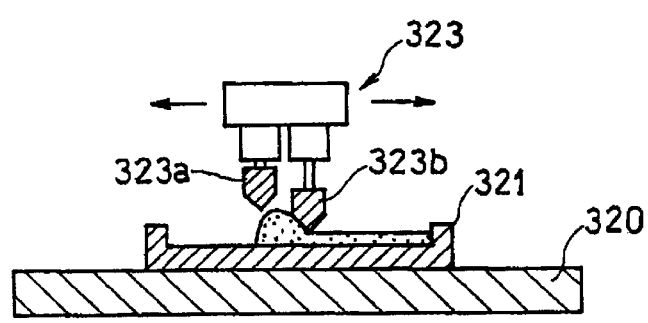

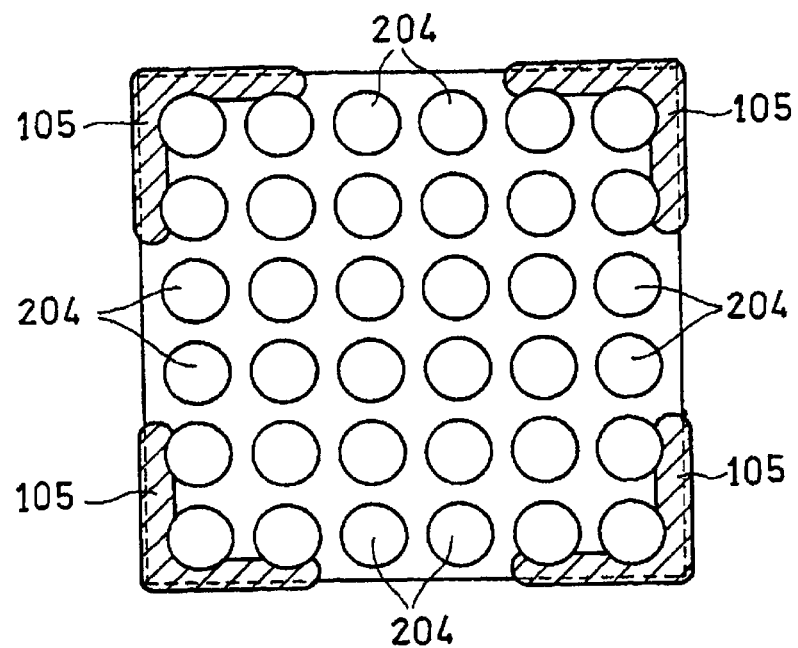
F I G. 18B

US 9,609,760 B2

ELECTRONIC COMPONENT MOUNTING METHOD

RELATED APPLICATIONS

This application is the U.S. National Phase under 35 U.S.C. § 371 of International Application No. PCT/JP2012/003626, filed on Jun. 1, 2012, which in turn claims the benefit of Japanese Application No. 2011-124483, filed on Jun. 2, 2011, the disclosures of which Applications are incorporated by reference herein.

TECHNICAL FIELD

The present invention relates to a method and a machine for placing or mounting on a substrate, an electronic component having a plurality of bumps.

BACKGROUND ART

Various electronic components are incorporated in electronic devices. These electronic components are joined at predetermined positions on a substrate having a plurality of electrodes and lead frames, and are incorporated as such as a mounting structure in the devices. With the advancement of miniaturization of electronic devices in recent years, the electronic components incorporated in the devices are being more and more miniaturized, thus causing increased use of small-sized electronic components such as flip chips and chip size packages (CSPs) to be placed on a substrate.

Electronic components such as flip chips and CSPs have a principal surface on which a plurality of terminals are regularly arranged in an array, and each terminal has a solder bump formed thereon. In mounting such an electronic component on the substrate, the bumps are allowed to land on the electrodes on the substrate, called lands. Thereafter, the bumps are heated and melted (ref lowed), and then left to cool, so that the interconnection between the electronic component and the substrate is achieved. As a result, the terminals of the electronic component are electrically connected with the electrodes on the substrate, whereas the electronic component is held on the substrate via solder joints.

In addition to electronic components such as flip chips and CSPs, electronic components called chip resistors, chip LEDs, and chip capacitors are often mounted in mounting structures. Such electronic components are placed on electrodes on a substrate, after a paste containing metal particles (e.g., cream solder) is applied to the electrodes by a method such as screen printing. Thereafter, the metal particles are melted by reflowing and left to cool, whereby the electronic components are joined to the substrate. In general, the paste containing metal particles is applied to the electrodes on a substrate before electronic components such as flip chips and CSPs are placed on the substrate.

When thermal stress generated by thermal cycling, or external force, is applied to a mounting structure comprising a substrate and electronic components obtained through the aforementioned mounting process, and if the electronic components are joined to the substrate via the bumps, the solder joints may lack sufficient strength. As a countermeasure, a reinforcing resin is used to join the electronic components to the substrate, thereby to reinforce the solder joints.

One method of reinforcing the solder joints with a reinforcing resin is to allow an underfill material to enter gaps between the substrate and the principal surface of the electronic component having bumps thereon.

One proposal suggests a method of dispensing a reinforcing resin onto a substrate in advance before placing thereon an electronic component, only at positions which correspond to those on the peripheral edge portion of the electronic component (c.f., Patent Literature 1). This method, as compared with that of using an underfill material, is better in terms of facilitating repair work on the mounting structure.

CITATION LIST

Patent Literature

[PTL 1] Japanese Laid-Open Patent Publication No. 2003-218508

SUMMARY OF INVENTION

Technical Problem

In Patent Literature 1, first, a reinforcing resin is dispensed onto a substrate at positions corresponding to those on the peripheral edge portion of the electronic component. Next, the electronic component having a plurality of bumps with flux applied thereto in advance, is placed on the substrate such that the bumps land on corresponding electrodes. At that time, the reinforcing resin comes in contact with the peripheral edge portion of the electronic component, whereby the reinforcing resin acts as an adhesive for fixing the electronic component to the substrate until the process proceeds to the reflow process. After reflowing, the reinforcing resin serves as a reinforcing portion for reinforcing the solder joints.

However, in dispensing a reinforcing resin onto the substrate, some of electrodes 102a are sometimes coated with a reinforcing resin 105 as illustrated in FIG. 1(a). That is, the smaller an electronic component 200 is in size, the closer the position on a substrate 101 corresponding to a peripheral edge portion 201x of the electronic component 200 is to the electrode 102a. Therefore, it is becoming more and more difficult to dispense the reinforcing resin 105 onto the substrate 101 so as not to come in contact with the electrode 102a. If a bump 204 on the electronic component 200 lands on the electrode 102a coated with the reinforcing resin 105, as illustrated in FIG. 1(b), flux 206 applied to the bump 204 fails to sufficiently spread and wet the electrode 102a; and most part of the electrode 102a remains wet with the reinforcing resin 105. If reflowing is performed in such a state, the molten bump cannot spread and wet the electrode 102a; and after cooling, a resin-reinforcing portion 105a will be present between the bump 204 and the electrode 102a as illustrated in FIG. 1(c), resulting in poor junction (poor electrical connection and insufficient joining strength) at the solder joint.

In another method, the flux 206 is applied to the electrode 102a in advance as illustrated in FIG. 2(a) by dispensing or other similar methods, and then the reinforcing resin 105 is dispensed onto the substrate 101. In such a method, if the bump 204 on the electronic component 200 lands on the electrode 102a coated with the reinforcing resin 105, the flux 206 applied to the electrode 102a fails to sufficiently spread and wet the bump 204, and most part of the bump 204 remains wet with the reinforcing resin 105 as illustrated in FIG. 2(b). Consequently, the bump melted by reflowing cannot spread and wet the electrode 102a; and after cooling, the resin-reinforcing portion 105a will be present between the bump 204 and the electrode 102a as illustrated in FIG. 2(c).

Solution to Problem

In view of the above, the present invention intends to provide an electronic component mounting method, an electronic component placement machine, and an electronic component mounting system that enable to prevent poor junction between the electronic component and the substrate.

One aspect of the present invention relates to an electronic component mounting method in which a first electronic component is mounted on a substrate, the first electronic component having a principal surface provided with a plurality of bumps, the substrate having a placement area provided with a plurality of first electrodes corresponding to the plurality of bumps.

The method includes the steps of:
providing the first electronic component;
providing the substrate;
applying flux to the plurality of bumps;
applying flux to at least one of the first electrodes, the at least one first electrode being adjacent to at least one reinforcement position set on a peripheral portion
of the placement area;
dispensing a thermosetting resin onto the reinforcement position, and at least partially coating the first electrode being adjacent to the reinforcement position and having the flux applied thereto, with the thermosetting resin;
placing the first electronic component on the substrate such that the bumps having the flux applied thereto land on the corresponding first electrodes, and thus bringing the thermosetting resin dispensed onto the reinforcement position into contact with a peripheral edge portion of the first electronic component; and
heating the substrate with the first electronic component placed thereon so as to melt the bumps and cure the thermosetting resin, followed by cooling, thereby to join the first electronic component to the substrate.

The step of applying the flux to the first electrode includes the steps of, for example: (a) allowing the bumps with the flux applied thereto to land on the corresponding first electrodes, thereby to transfer the flux to the first electrodes; and (b) after the flux has been transferred to the first electrodes, retracting the first electronic component away from the substrate. Here, the step of placing the first electronic component on the substrate, is the step of placing the retracted first electronic component on the substrate.

The step of applying the flux to the first electrode may alternatively include the steps of: (a) applying the flux to a transfer face of a transfer tool, the transfer face corresponding to the at least one first electrode adjacent to the reinforcement position; (b) allowing the transfer face with the flux applied thereto to land on the corresponding first electrode, thereby to transfer the flux to the first electrode; and (c) after the flux has been transferred to the first electrode, retracting the transfer tool away from the substrate.

Another aspect of the present invention relates to an electronic component placement machine configured to place a first electronic component on a substrate, the first electronic component having a principal surface provided with a plurality of bumps, the substrate having a placement area provided with a plurality of first electrodes corresponding to the plurality of bumps.

The machine includes:
a first component feeding unit for feeding the first electronic component;
a substrate holder for holding and positioning the substrate;
a transfer unit for providing a film of flux;
a movable placing head for placing the fed first electronic component on the substrate;
a movable dispensing head for dispensing a thermosetting resin onto at least one reinforcement position set on a peripheral portion of the placement area of the substrate; and
a control unit for controlling movements and operations of the placing head and the dispensing head.

In response to commands from the control unit,
the placing head
(i) transfers the flux from the film of the flux provided by the transfer unit, to the bumps on the first electronic component;
(ii) allows the bumps with the flux transferred thereto to land on the corresponding first electrodes, thereby to transfer the flux to the first electrodes; and
(iii) after the flux has been transferred to the first electrodes, retracts the first electronic component away from the substrate,
after the first electronic component has been retracted away from the substrate,
the dispensing head
(iv) dispenses the thermosetting resin onto the reinforcement position, and at least partially coats the first electrode being adjacent to the reinforcement position and having the flux applied thereto, with the thermosetting resin, and
after the thermosetting resin has been dispensed onto the reinforcement position,
the placing head
(v) places the retracted first electronic component on the substrate such that the bumps land on the corresponding first electrodes, and thus brings the thermosetting resin dispensed onto the reinforcement position into contact with a peripheral edge portion of the first electronic component.

Yet another aspect of the present invention relates to an electronic component placement machine configured to place a first electronic component on a substrate, the first electronic component having a principal surface provided with a plurality of bumps, the substrate having a placement area provided with a plurality of first electrodes corresponding to the plurality of bumps.

The machine includes:
a first component feeding unit for feeding the first electronic component;
a substrate holder for holding and positioning the substrate;
a transfer unit for providing a film of flux;
a movable placing head for placing the fed first electronic component on the substrate;
a movable dispensing head for dispensing a thermosetting resin onto at least one reinforcement position set on a peripheral portion of the placement area of the substrate;
a transfer tool having a transfer face corresponding to the first electrode adjacent to the reinforcement position; and
a control unit for controlling movements and operations of the placing head and the dispensing head.

In response to commands from the control unit,
the placing head
(i) transfers the flux from the film of the flux provided by the transfer unit, to the transfer face of the transfer tool;

(ii) allows the transfer face of the transfer tool, with the flux transferred thereto, to land on the corresponding first electrode, thereby to transfer the flux to the first electrode; and (iii) after the flux has been transferred to the first electrode, retracts the transfer tool away from the substrate, after the transfer tool has been retracted away from the substrate, the dispensing head (iv) dispenses the thermosetting resin onto the reinforcement position, and at least partially coats the first electrode being adjacent to the reinforcement position and having the flux applied thereto, with the thermosetting resin, and after the thermosetting resin has been dispensed onto the reinforcement position, the placing head (v) transfers the flux from the film of the flux provided by the transfer unit, to the bumps on the first electronic component; and (vi) places the first electronic component on the substrate such that the bumps with the flux transferred thereto land on the corresponding first electrodes, and thus brings the thermosetting resin dispensed onto the reinforcement position into contact with a peripheral edge portion of the first electronic component.

Still another aspect of the present invention relates to an electronic component mounting system configured to mount a first electronic component and a second electronic component on a substrate, the first electronic component having a principal surface provided with a plurality of bumps, the second electronic component having a connection terminal, the substrate having a first placement area provided with a plurality of first electrodes corresponding to the plurality of bumps and having a second placement area provided with a second electrode corresponding to the connection terminal.

The system includes:

a substrate feeding machine for feeding the substrate;

a screen printing machine for applying a paste containing metal particles by screen printing to the second electrode on the substrate carried from the substrate feeding machine;

an electronic component placement machine for placing the first electronic component and the second electronic component on the first placement area and the second placement area, respectively, of the substrate carried from the screen printing machine; and a reflow machine for heating the substrate carried from the electronic component placement machine, to melt the bumps and the metal particles, and cure the thermosetting resin.

The electronic component placement machine includes:

a first component feeding unit for feeding the first electronic component;

a second component feeding unit for feeding the second electronic component;

a substrate holder for holding and positioning the substrate;

a transfer unit for providing a film of flux;

a movable placing head for placing the fed first electronic component and the fed second electronic component on the substrate;

a movable dispensing head for dispensing the thermosetting resin onto at least one reinforcement position set on a peripheral portion of the first placement area of the substrate; and a control unit for controlling movements and operations of the placing head and the dispensing head.

In response to commands from the control unit, the placing head places the second electronic component on the substrate such that the connection terminal lands on the second electrode via the paste containing metal particles; and the placing head (i) transfers the flux from the film of the flux provided by the transfer unit, to the bumps on the first electronic component;

(ii) allows the bumps with the flux transferred thereto to land on the corresponding first electrodes, thereby to transfer the flux to the first electrodes; and (iii) after the flux has been transferred to the first electrodes, retracts the first electronic component away from the substrate, after the first electronic component has been retracted away from the substrate, the dispensing head (iv) dispenses the thermosetting resin onto the reinforcement position; and at least partially coats the first electrode being adjacent to the reinforcement position and having the flux applied thereto, with the thermosetting resin, and after the thermosetting resin has been dispensed onto the reinforcement position, the placing head (v) places the retracted first electronic component on the substrate such that the bumps land on the corresponding first electrodes; and thus brings the thermosetting resin dispensed onto the reinforcement position into contact with a peripheral edge portion of the first electronic component.

Yet still another aspect of the present invention relates to an electronic component mounting system configured to mount a first electronic component and a second electronic component on a substrate, the first electronic component having a principal surface provided with a plurality of bumps, the second electronic component having a connection terminal, the substrate having a first placement area provided with a plurality of first electrodes corresponding to the plurality of bumps and having a second placement area provided with a second electrode corresponding to the connection terminal.

The system includes:

a substrate feeding machine for feeding the substrate;

a screen printing machine for applying a paste containing metal particles by screen printing to the second electrode on the substrate carried from the substrate feeding machine;

an electronic component placement machine for placing the first electronic component and the second electronic component on the first placement area and the second placement area, respectively, of the substrate carried from the screen printing machine; and a reflow machine for heating the substrate carried from the electronic component placement machine, to melt the bumps and the metal particles, and cure the thermosetting resin.

The electronic component placement machine includes:

a first component feeding unit for feeding the first electronic component;

a second component feeding unit for feeding the second electronic component;

a substrate holder for holding and positioning the substrate;

a transfer unit for providing a film of flux;

a movable placing head for placing the fed first electronic component and the fed second electronic component on the substrate;

a movable dispensing head for dispensing the thermosetting resin onto at least one reinforcement position set on a peripheral portion of the first placement area of the substrate;

a transfer tool having a transfer face corresponding to the first electrode adjacent to the reinforcement position; and a control unit for controlling movements and operations of the placing head and the dispensing head.

In response to commands from the control unit, the placing head places the second electronic component on the substrate such that the connection terminal lands on the second electrode via the paste containing metal particles; and the placing head (i) transfers the flux from the film of the flux provided by the transfer unit, to the transfer face of the transfer tool;

(ii) allows the transfer face of the transfer tool, with the flux transferred thereto, to land on the corresponding first electrode, thereby to transfer the flux to the first electrode; and (iii) after the flux has been transferred to the first electrode, retracts the transfer tool away from the substrate, after the transfer tool has been retracted away from the substrate, the dispensing head (iv) dispenses the thermosetting resin onto the reinforcement position; and at least partially coats the first electrode being adjacent to the reinforcement position and having the flux applied thereto, with the thermosetting resin, and after the thermosetting resin has been dispensed onto the reinforcement position, the placing head (v) transfers the flux from the film of the flux provided by the transfer unit, to the bumps on the first electronic component; and (vi) places the first electronic component on the substrate such that the bumps with the flux transferred thereto land on the corresponding first electrodes, and thus brings the thermosetting resin dispensed onto the reinforcement position into contact with a peripheral edge portion of the first electronic component.

Advantageous Effects of Invention

According to the electronic component mounting method, the electronic component placement machine, and the electronic component mounting system of the present invention, even when the thermosetting resin dispensed as the reinforcing resin coats the electrodes provided on the substrate, the electrodes are sufficiently wetted with the molten bumps during reflowing. Therefore, poor junction at the solder joints can be prevented.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF DRAWINGS

FIG. 1 A series of drawings schematically illustrating how a solder joint is formed in a mounting process in which a bump on an electronic component, with flux applied thereto in advance, is allowed to land on an electrode coated with a reinforcing resin FIG. 2 A series of drawings schematically illustrating how a solder joint is formed in a mounting process in which a bump on an electronic component is allowed to land on an electrode with flux applied thereto in advance and coated with a reinforcing resin FIG. 3A A longitudinal sectional view of an example of a first electronic component having a plurality of bumps FIG. 3B A bottom view of the first electronic component of FIG. 3A

FIG. 6 A series of drawings to explain a process of applying flux to the first electrodes on the substrate by transfer method, using the first electronic component having a plurality of bumps FIG. 7 A series of drawings to explain a process of dispensing a reinforcing resin onto reinforcement positions of the substrate, followed by placement of the first electronic component FIG. 8 A series of drawings schematically illustrating how a solder joint is formed in a mounting process in which a bump on the first electronic component, with flux applied thereto in advance, is allowed to land on an electrode with flux applied thereto in advance and coated with a reinforcing resin FIG. 9 A series of drawings to explain a reflow process of heating the substrate with the first and second electronic components placed thereon FIG. 10A A front view of an example of a transfer tool having transfer faces corresponding to the first electrodes FIG. 10B A drawing to explain a process of applying flux to the first electrodes on the substrate by transfer method, using the transfer tool of FIG. 10A

DESCRIPTION OF EMBODIMENTS

First, an electronic component mounting method according to one embodiment of the present invention is described.

Here, a description is given with reference to a typical mounting structure which includes: a ball grid array (BGA) electronic component (first electronic component) to be connected to electrodes (lands) of a substrate via a plurality of bumps; and an electronic component (second electronic component) to be connected to the electrodes on the substrate via a paste containing metal particles such as cream solder.

First, a substrate, a first electronic component, and a second electronic component are prepared.

Figure 3A:
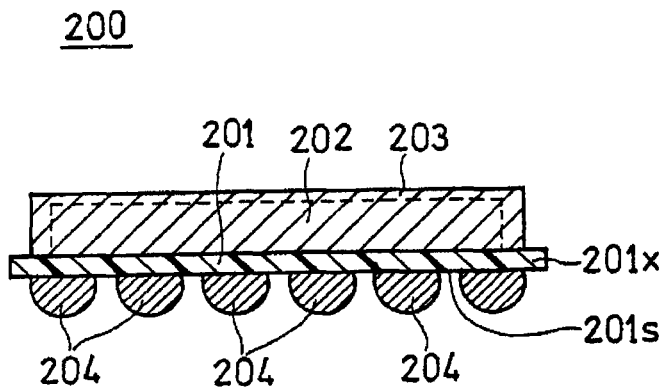
Figure 3B:
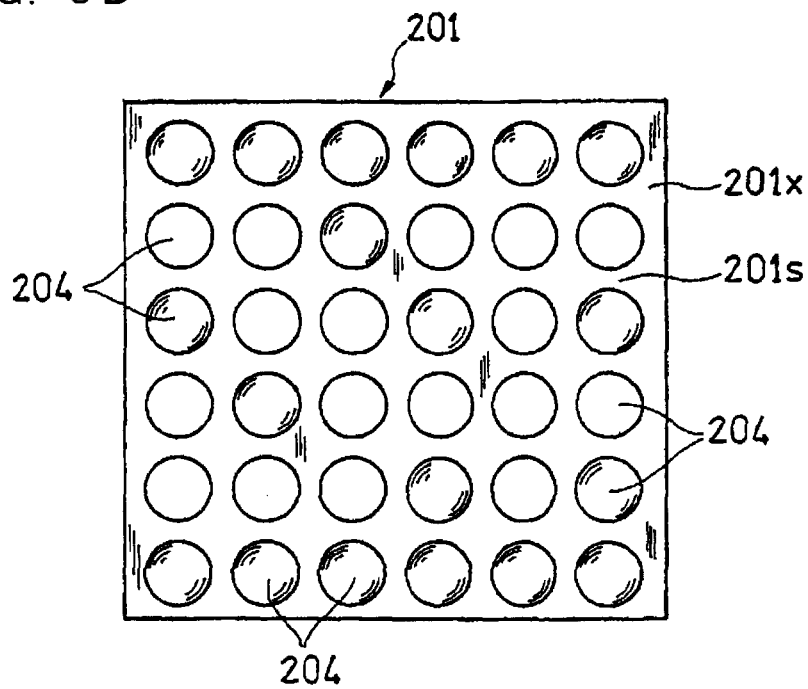

FIG. 3A is a longitudinal sectional view of an example of a first electronic component 200, and FIG. 3B is a bottom view thereof.

The first electronic component 200 is a package including a thin substrate (inner substrate) 201, a semiconductor element 202 mounted on the upper surface thereof, and a resin sealant 203 encapsulating the semiconductor element 202. The lower surface of the inner substrate 201 is a principal surface 201s of the first electronic component. The principal surface 201s has thereon a plurality of terminals regularly arranged in an array, and each terminal has a bump 204 formed thereon. The structure of the first electronic component is not limited to that illustrated in FIGS. 3A and 3B. Examples of the first electronic component include various forms of flip chips and chip size packages (CSPs).

Figure 4:
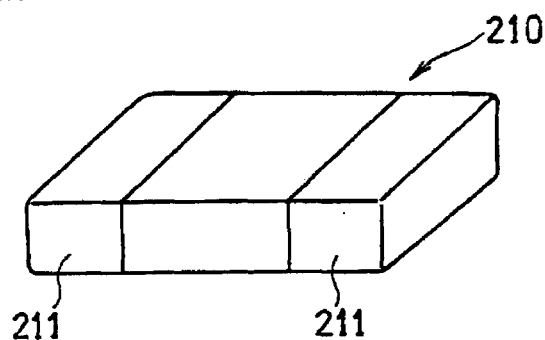
FIG. 4 An oblique view of an example of a chip-type second electronic component FIG. 5 A set of drawings to explain a process of applying a paste containing metal particles to second electrodes on a substrate, the substrate having first electrodes which correspond to the bumps on a first electronic component and having the second electrodes which correspond to connection terminals of a second electronic component.

FIG. 4 is an oblique view of an example of a second electronic component 210 to be placed together with the first electronic component 200 on the substrate. The second electronic component is a chip component having at least one connection terminal 211, and is, for example, a chip resistor, chip LED, or chip capacitor.

Figure 5:
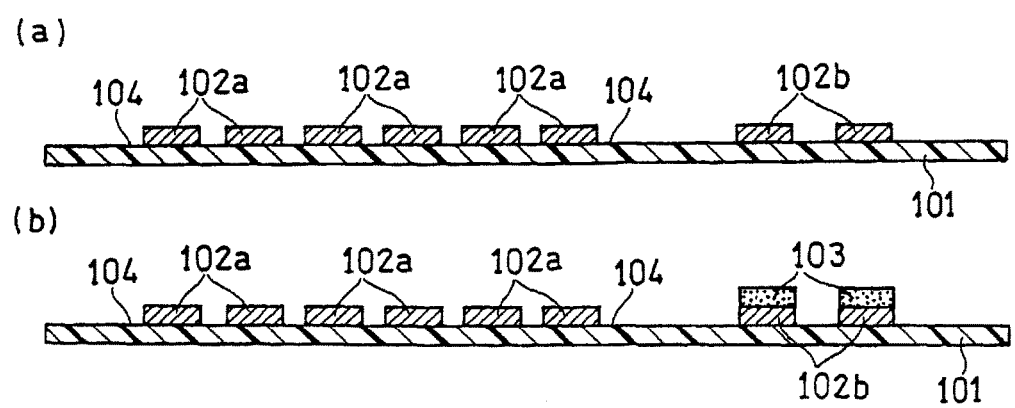

As illustrated in FIG. 5(a), a substrate 101 has a first placement area provided with first electrodes 102a to be connected to the bumps 204 on the first electronic component 200, and a second placement area provided with second electrodes 102b to be connected to the terminals 211 of the second electronic component 210. On a peripheral portion of the first placement area for placing the first electronic component 200 thereon, i.e., on an area corresponding to a peripheral edge portion 201x of the first electronic component 200, at least one reinforcement position 104 is set.

Two or more of the reinforcement positions 104 are usually set within the peripheral portion of the first placement area of the substrate 101. Here, the peripheral portion of the first placement area of the substrate 101 is a frame-like area set on the substrate, along the outline of the principal surface 201s of the first electronic component 200 having the bumps thereon. The reinforcement positions 104 are set at predetermined points within the frame-like area. The principal surface 201s of the typical BGA-type first electronic component 200 is rectangular. When the first electronic component is rectangular, the reinforcement positions are preferably set so as to correspond to at least the four corners, or vicinities of the four corners, of the first electronic component.

In the mounting process, first, as illustrated in FIG. 5(b), a paste 103 containing metal particles (e.g., cream solder) is applied to the second electrode 102b on the substrate 101 by screen printing. To apply the paste 103 to the second electrode 102b, the first electrodes 102a are, for example, covered with a mask.

When the paste 103 containing metal particles has the function of flux, the same paste may be applied to both the first and second electrodes 102a and 102b by screen printing performed once. However, note that such an application is possible in limited cases. In many cases, the first and second electrodes 102a and 102b have different thicknesses, or are required to have the film of the paste in different thicknesses.

On the other hand, as illustrated in FIG. 6(a), flux 206 is applied to the bumps 204 on the first electronic component 200. The method of applying the flux to the bumps 204 is not particularly limited, and includes, for example, a method in which a film of the flux 206 is formed on a pre-selected transfer table, and the bumps 204 on the first electronic component 200 are brought into contact with the film, thereby to allow the flux 206 to adhere (be transferred) to the bumps 204. As a result, the flux 206 is uniformly applied to the bumps 204 on the first electronic component 200. The thickness of the film of the flux may be adjusted appropriately, depending on the size of the bump 204, and the amount of the flux applied to each of the bumps.

Next, as illustrated in FIGS. 6(b) and 6(c), the bumps 204 on the first electronic component 200, with the flux 206 applied thereto, are allowed to land on the corresponding first electrodes 102a. The flux 206 is thus transferred and applied to all of the first electrodes 102a including those adjacent to the reinforcement positions 104. Thereafter, as illustrated in FIG. 6(d), the first electronic component 200 is lifted from the first electrodes 102a, and is temporarily retracted away from the substrate 101.

To move the first electronic component 200 as described above, a placing head movable in various directions and installed in a pre-selected electronic component placement machine can be used.

Next, as illustrated in FIG. 7(a), a reinforcing resin 105 is dispensed onto the reinforcement positions 104 set on the peripheral portion of the first placement area for the first electronic component 200. In dispensing the reinforcing resin 105, among the first electrodes 102a with the flux 206 applied thereto, at least those adjacent to the reinforcement positions 104 are at least partially coated with the reinforcing resin 105.

To dispense the reinforcing resin 105, a dispensing head movable in various directions and installed in a pre-selected electronic component placement machine can be used.

In the case of mounting the first electronic component that is rectangular, the reinforcing resin is dispensed onto points corresponding to at least the four corners, or vicinities of the four corners, of the first electronic component. Setting the reinforcement positions in such a layout increases the reinforcing effect, even with a small amount of the reinforcing resin. Moreover, this achieves well-balanced reinforcement, and hence, when the first electronic component is subjected to impact, less stress tends to be generated at the solder joints.

Note that the reinforcing resin 105 preferably coats only the first electrodes 102a at points corresponding to an area near the peripheral edge portion 201x of the first electronic component 200, i.e., only the first electrodes 102a at the outermost periphery among the regularly arranged first electrodes 102a. More preferably, the reinforcing resin 105 not entirely but partially coats the first electrode 102a (e.g., coats the edge portion thereof), if possible. Such coating can save not only the time and expense of repair when needed, but also the amount of the reinforcing resin 105 used, and therefore, is more economical.

After the reinforcing resin 105 has been dispensed onto the reinforcement positions 104, the previously retracted first electronic component 200 is moved back to above the first electrodes 102a of the substrate 101. The first electronic component 200 is then placed on the substrate 101, as illustrated in FIG. 7(b), such that the bumps 204 land on the corresponding first electrodes 102a. At that time, the reinforcing resin 105 is brought into contact with the peripheral edge portion 201x of the first electronic component 200. This enables the reinforcing resin 105 to act as an adhesive for fixing the first electronic component to the substrate 101 until the process proceeds to the reflow process. After reflowing, the reinforcing resin 105 cures and becomes a resin-reinforcing portion.

When the amount of the flux 206 adhering to the bumps 204 on the retracted first electronic component 200 is insufficient, the flux 206 may be transferred again to the bumps 204 for adherence thereto, before the first electronic component is placed on the substrate 101.

FIG. 7 illustrates the case where the reinforcing resin 105 coats only the edge portion of the first electrode 102a; however, the smaller the electronic component is in size, the more likely it is for the reinforcing resin 105 to entirely coat the first electrode 102a, as illustrated in FIGS. 1 and 2. Even in the latter case, according to the electronic component mounting method of the present invention, as illustrated in FIG. 8(a), the bump 204 with the flux 206 applied thereto is allowed to land on the first electrode 102a with the flux 206 applied thereto in advance. Therefore, poor junction as illustrated in FIGS. 1 and 2 is prevented. This is presumably because, when the first electronic component 200 is placed on the substrate 101, or as the reinforcing resin 105 becomes less viscous in the subsequent reflow process, the flux 206 applied to the first electrode 102a in advance and the flux 206 adhering to the bump 204 connect to each other, as illustrated in FIG. 8(b); and this facilitates the wetting of the electrode with the molten bump. Presumably, as a result, the bump melted by reflowing can dislodge the reinforcing resin 105, and spread and wet the electrode.

For the molten bumps to spread and wet the first electrodes, first, an oxide film present on a surface of the bumps must be sufficiently removed; and secondly, an oxide film present on a surface of the first electrodes must be sufficiently removed. To satisfy these conditions, there must be a sufficient amount of the flux adhering to the bumps and the first electrodes. However, in the case of FIG. 1(b), since the first electrode 102a is coated almost entirely with the reinforcing resin 105, the flux 206 can adhere to only a part of the first electrode 102a, leaving much of the oxide remaining on the surface of the first electrode 102a. In the case of FIG. 2(b), since the flux 206 adheres only to a tip end of the bump 204, only the oxide present at the tip end can be removed, leaving much of the oxide remaining on the surface of the bump 204. The remaining oxide as above inhibits the molten bump from dislodging the reinforcing resin 105, and from spreading and wetting the first electrode 102a. As a result, the solder joint tends to have an extremely narrow portion in the middle, which leads to poor junction.

Therefore, as the third condition for the molten bumps to spread and wet the first electrodes, the flux 206 applied to the first electrode 102a and the flux 206 adhering to the bump 204 should connect to each other as illustrated in FIG. 8(b). Ref lowing performed in such a state makes it easy for the molten bump to dislodge the reinforcing resin 105. Consequently, the molten bumps can sufficiently spread and wet the first electrodes 102a, without forming an extremely narrow portion in the solder joint, and therefore, poor junction can be prevented.

Prior to the reflow process, the second electronic component 210 is placed on the substrate 101 (FIG. 7(c)). Specifically, the second electronic component 210 is placed on the substrate 101 such that the connection terminals 211 land on the second electrodes via the paste 103 containing metal particles. The second component 210 may be placed either before or after the first electronic component 200 is placed; and, if possible, may be placed while the first electronic component 200 is being placed.

The electronic component mounting method of the present invention is not limited to the case of mounting the first and second electronic components 200 and 210 on the substrate 101. The second electronic component 210 may be mounted on the substrate 101 as needed, and the process of mounting the second electronic component 210 on the substrate 101 is not essential to the electronic component mounting method of the present invention. In other words, the substrate 101 does not necessarily have the second electrode 102b. Accordingly, the process of applying the paste 103 containing metal particles is also not essential.

In the reflow process, as illustrated in FIG. 9(a), the substrate 101 with the first and second electronic components 200 and 210 placed thereon is heated with a reflow machine. In the reflow machine, the molten bumps dislodge the reinforcing resin 105, and spread and wet the electrodes. Therefore, after cooling, the contact area is increased between the bumps and the electrodes. This ensures sufficient strength of the solder joints (FIG. 8(c)). At the completion of the soldering, as illustrated in FIG. 9(b), the shape of the bumps 204 is slightly deformed, and the distance between the first electronic component 200 and the first electrodes 102a is reduced.

In reflowing, if there is a displacement between the first electronic component 200 and the substrate 101, the self-alignment effect works to re-align them properly before the reinforcing resin 105 cures. In the present invention, since the wettability between the molten bumps and the first electrodes 102a is high, the self-alignment effect is also high. After the solder is cooled and solidified, the terminals of the first and second electronic components 200 and 210 are joined to the corresponding electrodes on the substrate 101.

The reinforcing resin 105 cures after the melting of the bumps 204 and the metal particles, forming the resin-reinforcing portion 105a. As a result, the reinforcement of the solder joints is achieved. When the flux 206 is a thermosetting flux, a cured matter 206a of the flux is formed. In this case, the flux washing process can be omitted.

In the above embodiment, a description is given of the case where the reinforcing resin 105 is dispensed only onto the reinforcement positions 104 on the peripheral portion of the first placement area; however, there is no particular limitation to the area onto which the reinforcing resin 105 is dispensed. For example, similar to an underfill material, the reinforcing resin 105 may be dispensed such that it fills the gaps between the inner substrate 201 of the first electronic component 200 and the substrate 101. In this case also, the state as illustrated in FIG. 8(b) can be achieved between the first electrode 102a and the bump 204, and therefore, similar to the above, the strength of the solder joints is ensured.

The method of applying the flux 206 to the first electrodes 102a is not limited to the method of utilizing the bumps 204 on the first electronic component 200. For example, the flux 206 may be applied to the first electrodes 102a by a dispensing method using a multi-point nozzle, or a transfer method using a transfer tool having a transfer face corresponding to the first electrode 102a. The flux 206 is not necessarily applied to all of the first electrodes 102a corresponding to the bumps 204, and, for example, the flux 206 may be applied only to the first electrodes 102a which might be at least partially coated with the reinforcing resin 105. The material of the flux to be applied to the first electrodes 102a is not necessarily the same as that to be applied to the bumps 204 on the first electronic component 200.

Next, as a modified embodiment of the above embodiment, an embodiment using a transfer tool having a transfer face corresponding to the first electrode 102a adjacent to the reinforcement position 104 is described.

Here, it suffices if the transfer tool has a transfer face corresponding to the first electrode 102a adjacent to the reinforcement position 104; however, the transfer tool may further have a transfer face corresponding to the first electrode 102a other than that adjacent to the reinforcement position 104. Specifically, the transfer tool may be one that can selectively apply the flux to the first electrode 102a adjacent to the reinforcement position 104, or to some of the first electrodes 102a including those adjacent to the reinforcement position 104; or one that can apply the flux 206 to all of the first electrodes 102a.

Figure 10A:
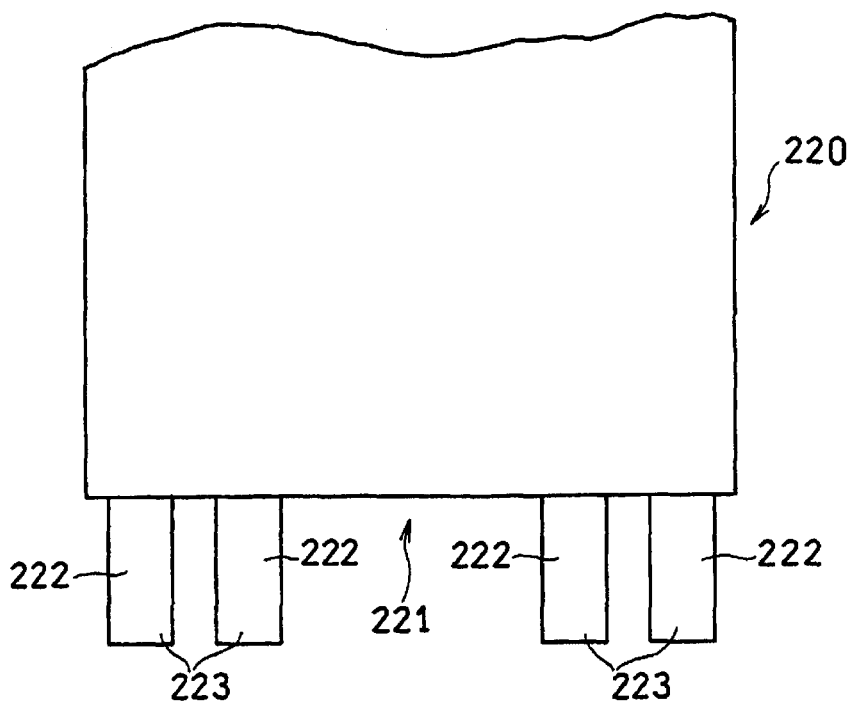
Figure 10B:
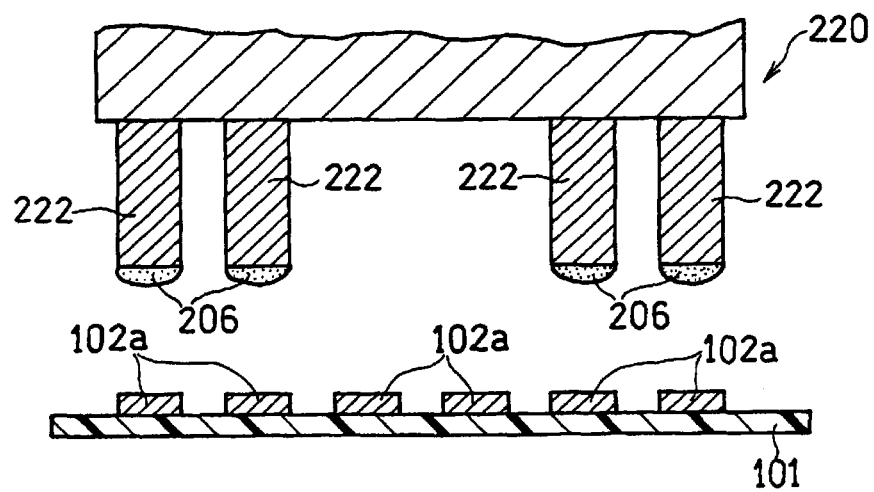

FIG. 10A is a front view of an exemplary transfer tool. FIG. 10B illustrates a process of transferring the flux 206 to the first electrodes 102a on the substrate 101, using a transfer tool 220 of FIG. 10A. A bottom surface of the transfer tool 220 is provided with projections 222 formed in a predetermined pattern. The formation pattern of the projections 222 may be selected appropriately according to the layout of the reinforcement positions 104 set on the substrate 101. For example, the number of the projections 222 may be the same as that of the first electrodes 102a. A top surface of the projections 222 serves as a transfer face 223 for transferring the flux 206 thereto. The transfer face may be a flat face or a curved face.

The flux 206 is transferred to the transfer faces 223 of the transfer tool 220, and then, the transfer faces 223 are allowed to land on the corresponding first electrodes 102a. In such a manner, the flux is applied to the first electrodes 102a. After the flux has been applied to the first electrodes 102a, the transfer tool 220 is retracted away from the first electrodes 102a. The method of transferring the flux 206 to the transfer faces 223 is not particularly limited, and includes, for example, a method in which, similar to when applying the flux 206 to the bumps 204 on the first electronic component 200, a film of the flux 206 is formed, and the transfer faces 223 are brought into contact with the film, thereby to allow the flux 206 to adhere (be transferred) to the transfer faces 223.

This modified embodiment is similar to the embodiment in which the first electronic component 200 is used to apply (transfer) the flux to the first electrodes 102a, except that the transfer tool 220 is used to apply (transfer) the flux to the first electrodes 102a. Specifically, for example, after the flux has been applied to the first electrodes 102a, the reinforcing resin 105 is dispensed onto the reinforcement positions 104; and then, the first electronic component 200 with the flux 206 applied thereto in advance is placed on the substrate 101.

Figure 11:
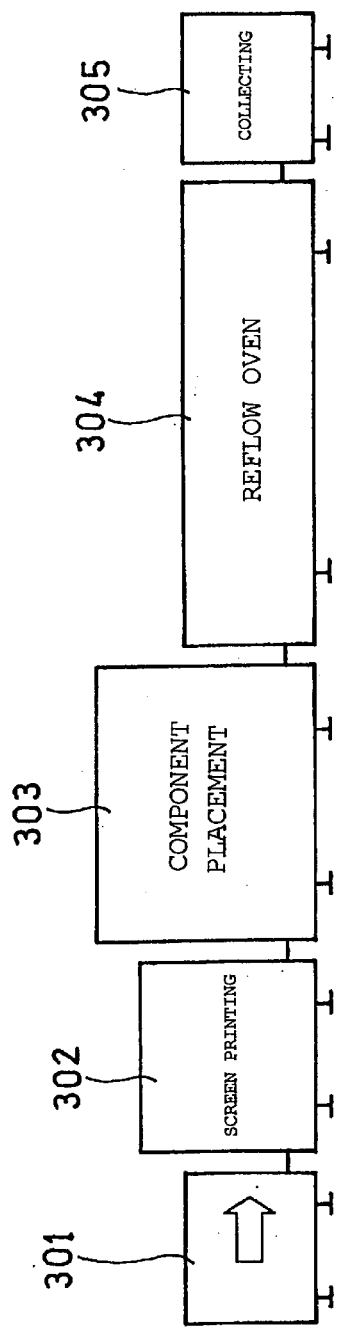
FIG. 11 A diagram showing the overall flow of an electronic component mounting system according to one embodiment of the present invention FIG. 12 A configuration drawing of an electronic component placement machine according to one embodiment of the present invention, seen from above FIG. 13 A top view of a transfer unit FIG. 14 A view taken along the line X-X of the transfer unit of FIG. 13

Next, by using FIG. 11, a description will be given of the overall flow of an exemplary electronic component mounting system for carrying out the electronic component mounting method of the present invention.

An electronic component mounting system 300 includes: a substrate feeding machine 301 for feeding a substrate on which electronic components are to be mounted; a screen printing machine 302 for applying a paste containing metal particles, by screen printing, to pre-selected electrodes (second electrodes 102b) on the substrate carried from the substrate feeding machine 301; an electronic component placement machine 303 for placing a first electronic component on electrodes (first electrodes 102a) different from the aforementioned pre-selected electrodes, on the substrate carried from the screen printing machine 302, and for placing a second electronic component on the electrodes with the paste containing metal particles applied thereto; and a reflow machine 304 for heating the substrate carried from the electronic component placement machine 303, thereby to join the first and second electronic components to the substrate. The substrate carried from the reflow machine 304, i.e., a mounting structure, is collected by a substrate collecting machine 305.

Figure 12:
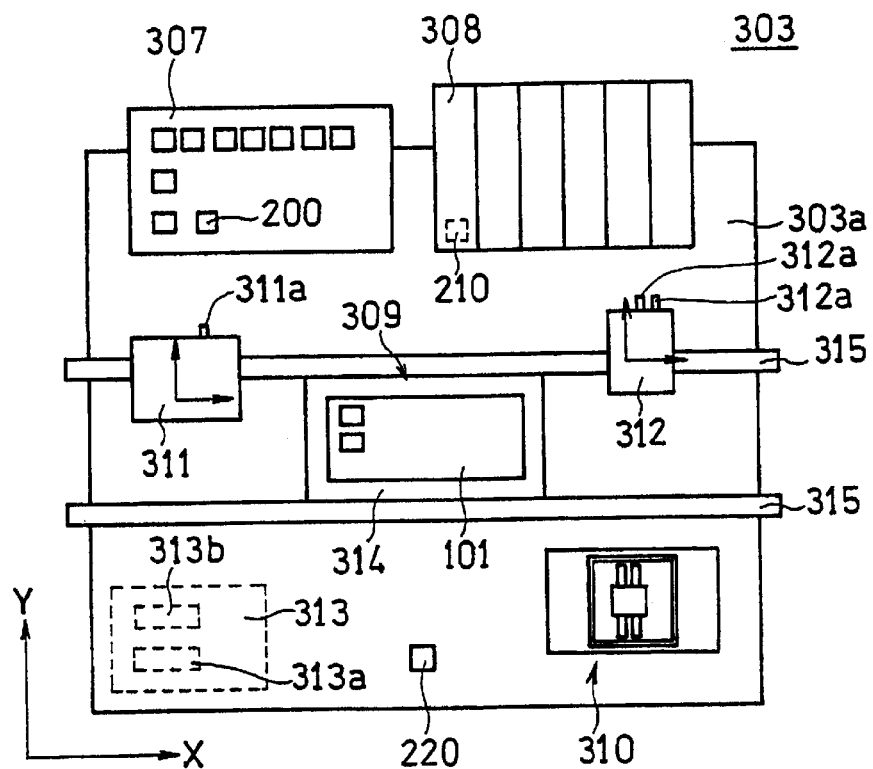

FIG. 12 is a configuration drawing of the electronic component placement machine 303 included in the electronic component mounting system 300, seen from above. The electronic component placement machine 303 includes: a base 303a; a first component feeding unit 307 for feeding the first electronic component 200; a second component feeding unit 308 for feeding the second electronic component 210; a substrate holder 309 for holding and positioning the substrate 101; a transfer unit 310 for providing a film of flux; a movable placing head 311 for placing the fed first and second electronic components 200 and 210 on the substrate 101; a movable dispensing head 312 for dispensing a thermosetting resin as a reinforcing resin 105; and a control unit 313 for controlling movements and operations of the placing head 311 and the dispensing head 312. Disposed on the base 303a are the first component feeding unit 307, the second component feeding unit 308, the substrate holder 309, and the transfer unit 310. The placing head 311 and the dispensing head 312 are supported by an X-Y movement mechanism (not shown) exclusive to each head. The X-Y movement mechanism is controlled by the control unit 313, and enables movements of the head in the space above the base 303a. The electronic component placement machine 303 may include a transfer tool 220 having a transfer face for transferring the film of the flux.

The first component feeding unit 307 may have any structure, and includes, but is not limited to, a tray feeder for feeding a tray having thereon the first electronic components 200 arranged in a grid, to the pickup position of the placing head 311.

The first electronic component 200 is a comparatively small-sized BGA electronic component, as illustrated in FIGS. 3A and 3B, having a principal surface 201s provided with bumps 204.

The second component feeding unit 308 may also have any structure, and includes, but is not limited to, a tape feeder for feeding a tape at a predetermined pitch to the pickup position of the placing head 311, the tape holding the second electronic components 210 with a predetermined distance therebetween. The second electronic component 210 is not particularly limited, and is, for example, a chip component having connection terminals as illustrated in FIG. 4.

The substrate holder 309 for holding and positioning the substrate 101 may have any structure, and comprises, for example, as illustrated in FIG. 12, substrate carrying conveyors 315 for carrying a carrier 314 holding the substrates 101. The substrate carrying conveyors 315 carry the substrate 101 to where the placement of each of the electronic components is performed, and positions it there. The substrate carrying conveyors 315 therefore function as the substrate holder 309.

The placing head 311 includes a suction nozzle 311a that is moved up and down by a built-in up-and-down movement mechanism. The placing head 311 picks up the first electronic component 200 from the first component feeding unit 307, and the second electronic component 210 from the second component feeding unit 308, by the suction nozzle 311a moving down and up and performing suction; and then, places each of the electronic components on the substrate 101, by the suction nozzle 311a moving down and up and performing suction release (vacuum break) from above a predetermined point of the substrate 101.

The movable dispensing head 312 for dispensing the thermosetting resin as the reinforcing resin 105 has therein a dispenser having dispensing nozzles 312a that ejects the reinforcing resin 105, and an up-and-down movement mechanism by which the dispensing nozzles 312a move up and down. The placing head and the dispensing head may be supported by an X-Y movement mechanism exclusive to each of the heads and allowed to move in a predetermined space including the space above the substrate; or the placing head may be integrated with the dispensing head, and they may move as one in a predetermined space by a shared X-Y movement mechanism.

The movements of the placing head 311 and the operations thereof such as picking up and placing of the electronic components are controlled by commands from the control unit 313. Likewise, the movements of the dispensing head 312 and the operations of the dispensing nozzles 312a such as ejecting of the reinforcing resin 105 therefrom, are controlled by commands from the control unit 313. The control unit 313 comprises, for example: a storage device 313a, such as a memory or hard disk, that stores programs for controlling the movements and operations of the placing head 311 and the dispensing head 312; a central arithmetic unit 313b, such as CPU or MPU; various interfaces; and/or a personal computer.

Figure 13:
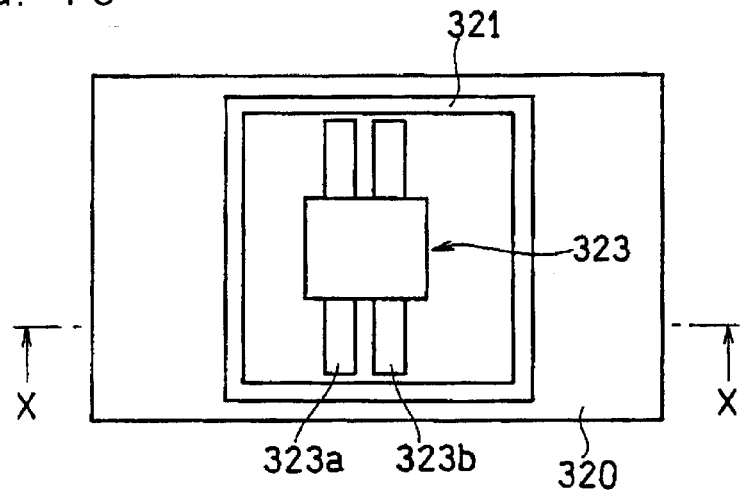

The transfer unit 310 which provides the film of the flux is not particularly limited, and may be any one that has a mechanism capable of providing the film of the flux having a thickness suitable for being transferred to the bumps 204 on the first electronic component 200 or the transfer faces of the transfer tool 220. For example, as illustrated in FIG. 13, the transfer unit 310 comprises: a base table 320; a transfer table 321 disposed on top of the base table 320; and a squeegee unit 323 disposed above the transfer table 321. The squeegee unit 323 comprises a first squeegee member 323a and a second squeegee member 323b, both having a length nearly equal to the width of the transfer table 321 in the Y-axis direction thereof; and they are arranged in parallel to the Y-axis direction with a certain distance therebetween. The squeegee members are freely movable up and down, i.e., freely movable toward and away from the film formed on the transfer table 321, by an up-and-down movement mechanism built in the squeegee unit 323.

As illustrated in FIG. 14, after the flux 206 has been provided between the first squeegee member 323a and the second squeegee member 323b, the squeegee unit 323 is moved in directions indicated by the arrows; and the first and second squeegee members 323a and 323b are moved up and down at predetermined timings, whereby a film of the flux is provided.

Next, a description is given of a process of placing the first and second electronic components 200 and 210 on the substrate 101.

The placing head 311, in response to commands from the control unit 313, (i) transfers the flux 206 from the film of the flux provided by the transfer unit 310, to the bumps 204 on the first electronic component 200; (ii) allows the bumps 204 with the flux 206 transferred thereto to land on the corresponding first electrodes 102a, thereby to transfer the flux 206 to the first electrodes 102a; and (iii) after the flux 206 has been transferred to the first electrodes 102a, retracts the first electronic component 200 away from the substrate 101. Upon passing of a predetermined time from when the first electronic component 200 is retracted, the placing head 311 (iv) places the retracted first electronic component 200 on the substrate 101 such that the bumps 204 land on the corresponding first electrodes 102a, and if necessary, (v) places the second electronic component 210 on the substrate 101 such that the connection terminals 211 land on the second electrodes 102b via the paste 103 containing metal particles.

The dispensing head 312, in response to commands from the control unit 313, dispenses the thermosetting resin as the reinforcing resin 105 onto the reinforcement positions 104 during the aforementioned predetermined time. At that time, the first electrodes 102a with the flux 206 applied thereto and adjacent to the reinforcement positions 104 are coated with the thermosetting resin. The amount of the reinforcing resin 105 to be dispensed onto the reinforcement position 104 is set such that the resin comes in contact with the peripheral edge portion of the first electronic component, when, upon passing of the aforementioned predetermined time, the retracted first electronic component 200 is placed on the substrate 101.

In the following, the specific process flow is described with reference to the flowchart of FIG. 15.

Upon recognizing that the substrate 101 has been positioned by the substrate holder 309 (SP0), the control unit 313 starts controlling the movements and operations of the placing head 311 as below. First, the placing head 311 picks up the first electronic component 200 from the first component feeding unit 307 (SP1), and moves the first electronic component 200 to the transfer unit 310 (SP2). Next, the placing head 311 brings the bumps 204 on the first electronic component 200 into contact with the film of the flux formed on the transfer table of the transfer unit 310, thereby to transfer the flux to the bumps 204 (SP3). In such a manner, the flux 206 is applied to the bumps 204 on the first electronic component 200, as illustrated in FIG. 6(a). The thickness of the film of the flux is adjusted appropriately, depending on the size of the bump 204, and the amount of the flux applied to each of the bumps. Note that, in transferring the flux 206 to the bumps 204, it is preferable to control positioning such that the first electronic component 200 lands on the film of the flux at a predetermined position.

Next, the placing head 311 moves the first electronic component 200 to above the first electrodes 102a on the substrate 101 (SP4), and allows the bumps 204 to land on the corresponding first electrodes 102a, thereby to transfer the flux 206 to the first electrodes 102a (SP5). Then, the placing head 311 retracts the first electronic component 200 away from the substrate 101 (SP6). The first electronic component 200 may be retracted to any position, without particular limitation, where it would not impede the subsequent operations of the dispensing head 312 over the substrate 101.

Next, the control unit 313 controls the movements and operations of the dispensing head 312 as below. First, the dispensing head 312 moves to above the substrate 101, and is positioned with respect to the preset reinforcement positions 104 (SP7). Then, the dispensing head 312, as illustrated in FIG. 7(a), dispenses the reinforcing resin 105 through the dispensing nozzles 312a onto the reinforcement positions 104 on the substrate 101 (SP8). At that time, the first electrodes 102a adjacent to the reinforcement positions 104 are at least partially coated with the reinforcing resin 105.

Note that, in order to avoid the reinforcing resin 105 from coming in contact with the first electrodes 102a, the properties, dispensing amount, dispensing position, etc. of the reinforcing resin 105 must be controlled at an extremely high level. Such a high level of control, however, is more difficult as the first electronic component 200 is smaller in size, and is detrimental to productivity.

The dispensing head 312 has the dispensing nozzles 312a with a small diameter, as illustrated in FIG. 7(a). The reinforcing resin 105 is dispensed in dots or lines onto the reinforcement positions 104 through the dispensing nozzles 312a. By adjusting the amount of the reinforcing resin 105 to be dispensed, it is possible to bring the reinforcing resin 105 into sufficient contact with the peripheral edge portion 201x of the first electronic component 200, when, upon passing of the aforementioned predetermined time, the first electronic component 200 is placed on the substrate 101. Note that adjusting the amount of the reinforcing resin 105 not to be too much can improve productivity and ease repair work. Moreover, this can prevent defects such as the reinforcing resin 105 being squeezed out.

Thereafter, in response to commands from the control unit 313, the placing head 311 moves the first electronic component 200 back to above the first electrodes 102a on the substrate 101, and places the first electronic component 200 on the substrate 101 such that the bumps 204 land on the corresponding first electrodes 102a (SP9).

As described above, the first electronic component 200 is placed on the substrate 101 upon passing of a predetermined time from when the first electronic component 200 is temporarily retracted away from the substrate 101. Such time is set equal to or longer than the time from when the first electronic component 200 is retracted away from the substrate 101, up to when the dispensing head 312 completes its operation of dispensing the reinforcing resin 105 onto the reinforcement positions 104 set on the substrate 101.

After the first electronic component 200 has been placed on the substrate 101, the placing head 311, in response to commands from the control unit 313, picks up the second electronic component 210 from the second component feeding unit 308 (SP10), moves the second electronic component 210 to above the second electrodes 102b on the substrate 101 (SP11), and places the second electronic component 210 on the substrate 101 such that the connection terminals land on the paste 103 on the second electrodes 102b (SP12). Subsequently, the substrate with the first and second electronic components 200 and 210 placed thereon is subjected to reflowing (SP13), and then collected.

The first and second electronic components may be placed in any order, without being limited to the above order. For example, the second electronic component 210 and then the first electronic component 200 may be placed on the substrate. In other words, the steps from SP10 to SP12 may be performed first, and then followed by the steps from SP1 to SP9. When the placing head 311 has two or more of the? suction nozzles, the first and second electronic components 200 and 210 may be successively or simultaneously picked up.

In allowing the bumps 204 on the first electronic component 200 to land on the film of the flux or the first electrodes 102a, and the connection terminals 211 of the second electronic component 210 to land on the second electrodes 102b, an image recognition system may be used for accurate positioning. Likewise, in positioning the dispensing head 312, an image recognition system may be used for accurate positioning.

Figure 16:
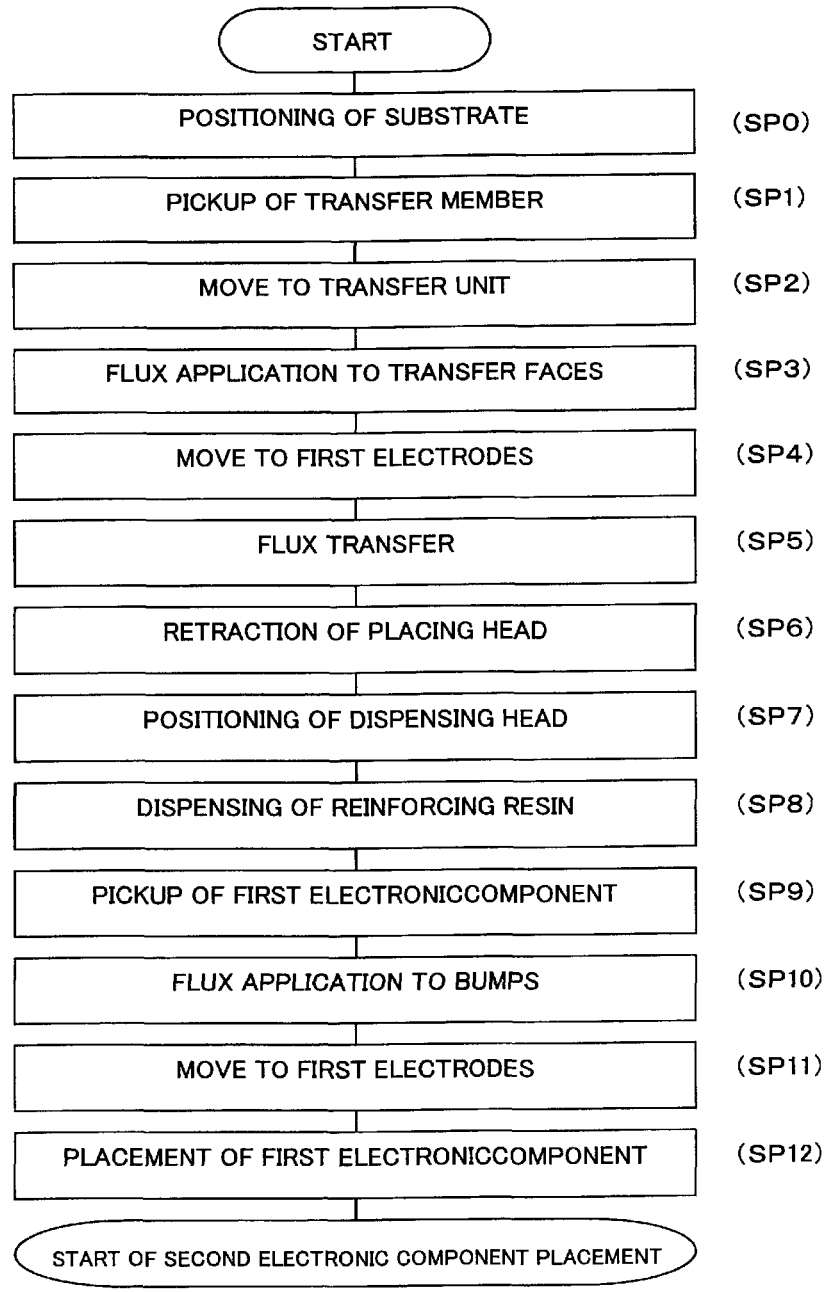

Next, the specific process flow in the case of using a transfer tool is described with reference to the flowchart of FIG. 16.

Upon recognizing that the substrate 101 has been positioned by the substrate holder 309 (SP0), the control unit 313 starts controlling the movements and operations of the placing head 311 as below. First, the placing head 311 moves to where the transfer tool 220 is installed, and picks up the transfer tool 220 (SP1); and then moves the transfer tool 220 to the transfer unit 310 (SP2). The transfer tool 220 has a rectangular bottom 221 having almost the same area as that of the first electronic component 200, and the bottom 221 is provided with the projections 222 formed so as to correspond to the first electrodes 102a adjacent to the reinforcement positions 104. The transfer tool 220 may be incorporated, together with a pre-selected up-and-down movement mechanism, in the placing head 311. In that case, the above pickup of the transfer tool from its installed place can be omitted. In that case, the transfer tool 220 is operated by the up-and-down movement of the incorporated up-and-down movement mechanism, to transfer the flux 206 to the first electrodes 102a.

At the transfer unit 310, the placing head 311 brings the tip ends of the projections 222, i.e., the transfer faces 223, of the transfer tool 220 into contact with the film of the flux 206 formed on the transfer table 321, thereby to transfer the flux 206 to the transfer faces 223 (SP3). The thickness of the film of the flux 206 is adjusted appropriately depending on the height, etc. of the projections 222.

The placing head 311 moves the transfer tool 220 with the flux 206 applied to the transfer faces 223, to above the first electrodes 102a of the substrate 101 (SP4), and allows the transfer faces 223 to land on the corresponding first electrodes 102a, thereby to transfer the flux 206 to the first electrodes 102a (SP5). Thereafter, the placing head 311 retracts the transfer tool 220 away from the first electrodes 102a (SP6). The position to which the transfer tool 220 is retracted may be the same as the position to which the first electronic component 200 is retracted.

Figure 15:
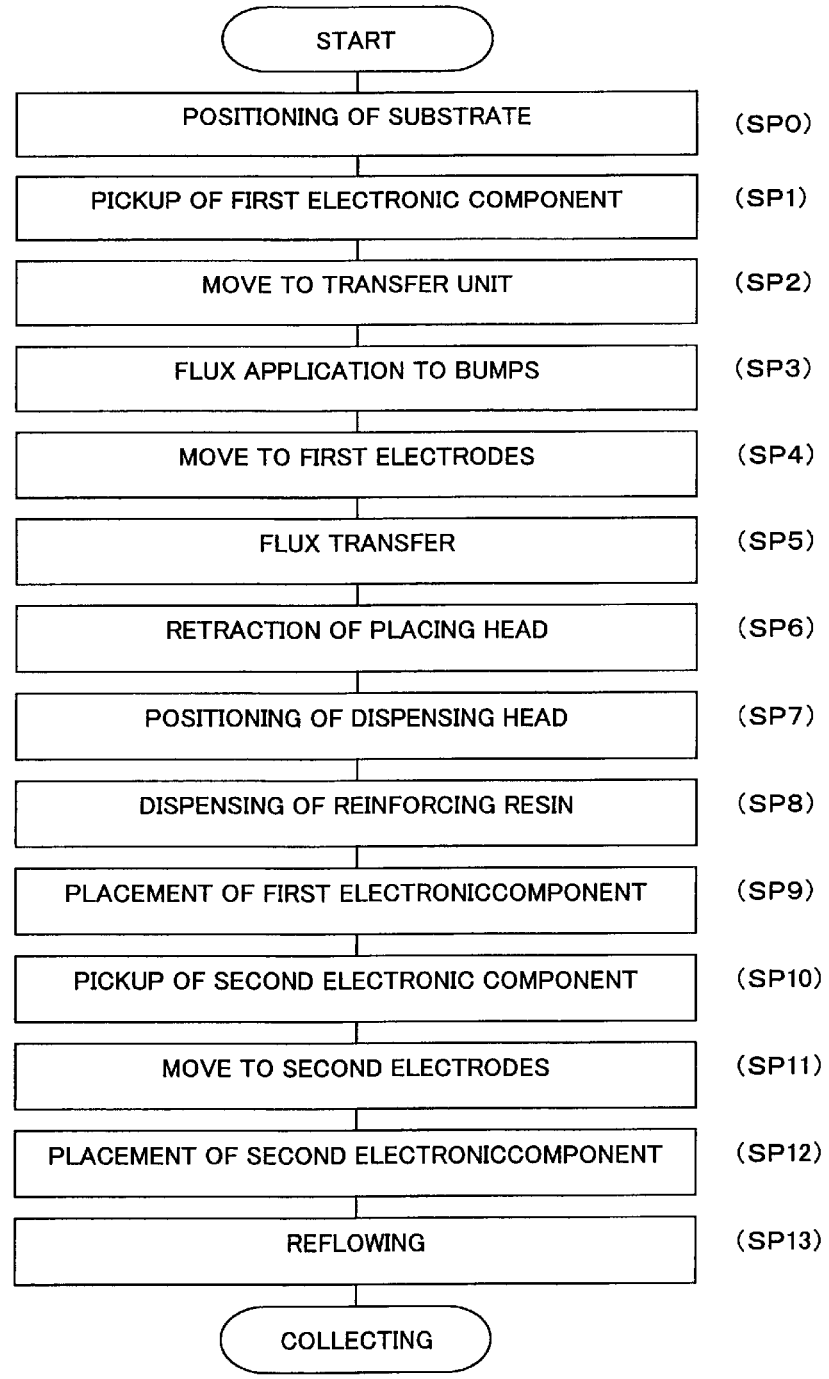
FIG. 15 A flowchart of the steps for applying flux to the first electrodes on the substrate by transfer method, using the first electronic component having a plurality of bumps; and placing the first and second electronic components on the substrate FIG. 16 A flowchart of the steps for applying flux to the first electrodes on the substrate by transfer method, using the transfer tool having transfer faces corresponding to the first electrodes; and placing the first and second electronic components on the substrate FIG. 17 A diagram showing a control system in an electronic component placement machine according to one embodiment of the present invention FIG. 18A A plan view of a rectangular first electronic component with reinforcing resin dispensed at four reinforcement positions FIG. 18B A bottom view of the first electronic component of FIG. 18A

Next, the control unit 313 controls the dispensing head 312 in a manner similar to SP7 and SP8 in the flowchart of FIG. 15, to dispense the reinforcing resin 105 onto the reinforcement positions 104.

After the thermosetting resin 105 has been dispensed, the placing head 311, in response to commands from the control unit 313, picks up the first electronic component 200 from the first component feeding unit 307 (SP9), and applies the flux 206 to the bumps 204 in a manner similar to SP2 and SP3 in the flowchart of FIG. 15 (SP10). Subsequently, the placing head 311 moves the first electronic component 200 to above the first electrodes 102a of the substrate 101 (SP11), and places the first electronic component 200 on the substrate 101 such that the bumps 204 land on the corresponding first electrodes 102a (SP12).

Thereafter, the second electronic component 210 is placed in a manner similar to that described with reference to FIG. 15, and the substrate with the first and second electronic components 200 and 210 placed thereon is subjected to reflowing, and then collected. Here also, the order of placing the first and second electronic components is not limited to the above order. For example, the second electronic component 210 may be placed first, and then SP1 to SP12 may be carried out.

The configuration of the electronic component placement machine 303 is not limited to that illustrated in FIG. 12. For example, the second component feeding unit 308 for feeding the second electronic component 210 is incorporated as needed in the electronic component placement machine 303, and is not essential to the electronic component placement machine of the present invention. In other words, in the present invention, the movements and operations of the placing head 311 with respect to the second electronic component 210 may not be performed.

Figure 17:
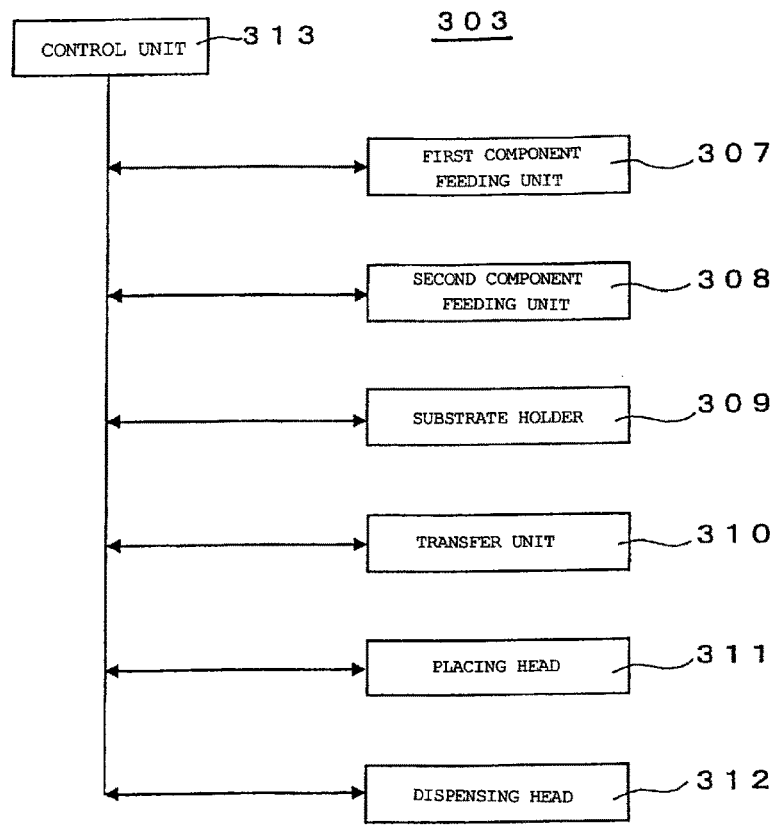

Moreover, as shown in FIG. 17, the control unit 313 may be configured to control not only the placing head 311 and the dispensing head 312, but also at least one or all of the first component feeding unit 307, the second component feeding unit 308, the substrate holder 309, and the transfer unit 310. For example, the control unit 313 may control the timing when the transfer unit 310 forms the film of the flux, such that it is formed on the transfer table 321 before the first electronic component 200 or the transfer tool 220 arrives at the transfer unit 310.

Next, a specific description is given of the dispensing pattern of the reinforcing resin 105.

Figure 18A:
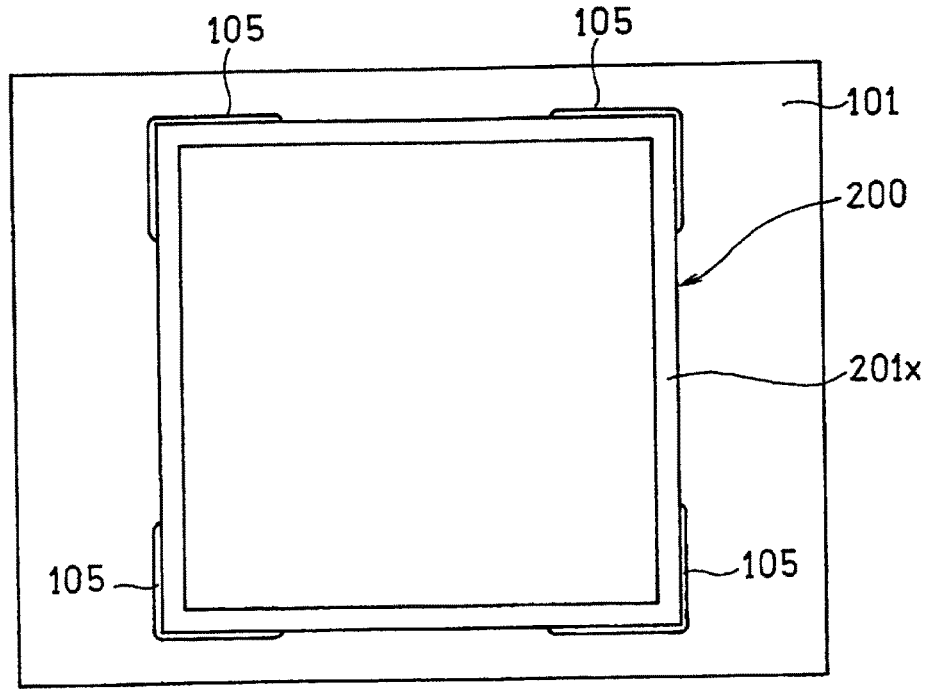

FIG. 18A is a plan view of the first electronic component 200 when rectangular, on which the reinforcing resin 105 is dispensed onto the four reinforcement positions corresponding to the four corners of the peripheral edge portion 201x of the rectangular first electronic component 200. FIG. 18B is a view of a bottom (the principal surface 201s having a plurality of bumps) of the first electronic component of FIG. 18A. The reinforcing resin 105 is dispensed onto the reinforcement positions so as to only partially coat the first electrodes 102a at the outermost periphery, although not illustrated. Note that there is no particular limitation to the dispensing pattern of the reinforcing resin 105.

Figure 19:
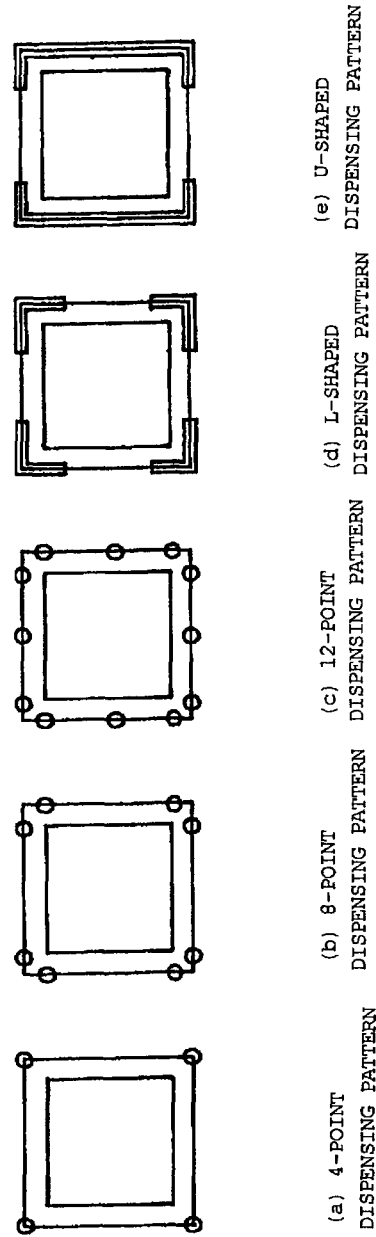
FIG. 19 A set of exemplary dispensing patterns of reinforcing resin

FIG. 19 illustrates five exemplary dispensing patterns of the reinforcing resin. In a 4-point dispensing pattern (a), an 8-point dispensing pattern (b), a 12-point dispensing pattern (c), and an L-shaped dispensing pattern (d), a plurality of the reinforcement positions are set at or near the four corners of the peripheral edge portion of the rectangular first electronic component. In a U-shaped dispensing pattern (e) also, the reinforcement positions are set to include the four corners and vicinities thereof. In the order of the dispensing patterns (a) to (e), the reinforcement effect increases, whereas the dispensing time becomes longer, and the amount of the reinforcing resin used becomes larger. On the other hand, in the order of the dispensing patterns (e) to (a), repair work (reworkability) becomes easier. The dispensing pattern may be selected appropriately, depending on the size and the production tact of the first electronic component, with the reinforcement effect taken into consideration.

The reinforcing resin may be dispensed to coat the peripheral edge portion almost entirely. In that case, it is desirable to provide an aperture for releasing gas, because gas may be generated from the reinforcing resin or flux during reflowing of the bumps.

Next, a description is given of the flux.

The flux may be any material that acts, in soldering, to remove the oxide from the surface of the first electrodes and from the surface of the bumps, and reduce the surface tension of the solder. These actions (hereinafter, "activating actions") increase the wettability between the solder and the first electrodes, making possible a highly reliable and good soldering.

The flux composition is not particularly limited, and includes, for example, a base material such as rosin, an activator such as an organic acid or a hydrohalogenic acid salt, a solvent, and a thixotropic agent.

In the present invention, a thermosetting flux is preferably used, assuming that the flux comes in contact with the thermosetting resin serving as the reinforcing resin. In the case of using a thermosetting flux, even when the flux is mixed with the reinforcing resin, the normal thermal curing of the reinforcing resin is unlikely to be inhibited. This is presumably because the migration of active components of the flux to the reinforcing resin is suppressed.

The thermosetting flux can be obtained by adding a thermosetting resin to flux. A preferable example of the thermosetting resin added to flux is an epoxy resin because of its excellent heat resistance.

Next, a description is given of the reinforcing resin.

The reinforcing resin comprises a thermosetting resin. Examples of the thermosetting resin include epoxy resins, phenol resins, melamine resins, and urethane resins. The thermosetting resin may contain a curing agent, a cure accelerating agent, and the like. The curing agent is preferably, for example, an acid anhydride, an aliphatic or aromatic amine, or an imidazole or a derivative thereof. The cure accelerating agent is, for example, dicyandiamide.

The reinforcing resin preferably contains a component that acts to remove the oxide from the surfaces of the first electrodes and/or the bumps. For example, an activator to be contained in the flux may be added to the reinforcing resin. This ensures reliable wetting between the molten bumps and the first electrodes, even when the reinforcing resin comes in contact with the first electrodes or the bumps.

The reinforcing resin is preferably formulated such that the resin cures after the first electrodes have been sufficiently wetted with the molten bumps during reflowing. The viscosity of the reinforcing resin before thermal curing tends to decrease with increase in temperature. Therefore, by allowing the curing reaction of the reinforcing resin to finish after the melting of the bumps, the molten bumps can easily exert their self-alignment effect. For example, by setting the curing temperature of the reinforcing resin to be higher than the melting temperature (melting point) of the bumps, the self-alignment effect can be exerted reliably. The curing temperature of the reinforcing resin can be determined as a peak temperature of a curve representing the relationship between the temperature and the heat flow, obtained by differential scanning calorimetry (DSC).

The present invention is applicable, not only to the case where one kind of the first electronic component is placed on the substrate, but also to the case where two or more kinds of the first electronic components are placed on the substrate. In the latter case, the electronic component placement machine may, as necessary, be equipped with a nozzle stocker that holds a plurality of suction nozzles to be attached to the placing head, so that the suction nozzle can be replaced according to the kind of the first electronic component. Likewise, the present invention is applicable, not only to the case where one kind of the second electronic component is placed on the substrate, but also to the case where two or more types of second electronic components are placed on the substrate.

INDUSTRIAL APPLICABILITY

According to the electronic component mounting method, the electronic component placement machine, and the electronic component mounting system of the present invention, even when the electrodes provided on the substrate are coated with the reinforcing resin, the electrodes are sufficiently wetted with the molten bumps during reflowing, and the strength of the solder joints can be ensured. Therefore, they are useful in the field of surface mounting of BGA electronic components and other components.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. An electronic component mounting method in which a first electronic component is mounted on a substrate, the first electronic component having a principal surface provided with a plurality of bumps, the substrate having a placement area provided with a plurality of first electrodes corresponding to the plurality of bumps, the method comprising the steps of:
    providing the first electronic component;
    providing the substrate;
    applying flux to the plurality of bumps;
    applying flux to at least one of the first electrodes, the at least one first electrode being adjacent to at least one reinforcement position set on a peripheral portion of the placement area;
    dispensing a thermosetting resin onto the reinforcement position, and at least partially coating an upper surface of the at least one of the first electrodes having the applied flux and being adjacent to the reinforcement position, with the thermosetting resin;
    after dispensing the thermosetting resin onto the reinforcement position and coating the upper surface of the at least one of the first electrodes having the applied flux, placing the first electronic component on the substrate such that the bumps having the flux applied thereto land on the corresponding first electrodes, and thus bringing the thermosetting resin dispensed onto the reinforcement position into contact with a peripheral edge portion of the first electronic component; and
    heating the substrate with the first electronic component placed thereon the substrate so as to melt the bumps and cure the thermosetting resin, followed by cooling, thereby to join the first electronic component to the substrate.

2. The electronic component mounting method according to claim 1, wherein
    the step of applying the flux to the first electrode comprises the steps of:
    (a) allowing the bumps with the flux applied thereto the bumps to land on the corresponding first electrodes, thereby to transfer the flux to the first electrodes; and
    (b) after the flux has been transferred to the first electrodes, retracting the first electronic component away from the substrate, and
    the step of placing the first electronic component on the substrate is the step of placing the retracted first electronic component on the substrate.

3. The electronic component mounting method according to claim 1, wherein
    the step of applying the flux to the first electrode comprises the steps of:
    (a) applying the flux to a transfer face of a transfer tool, the transfer face corresponding to the at least one first electrode adjacent to the reinforcement position;
    (b) allowing the transfer face with the flux applied thereto the transfer face to land on the corresponding first electrode, thereby to transfer the flux to the first electrode; and
    (c) after the flux has been transferred to the first electrode, retracting the transfer tool away from the substrate.

4. The electronic component mounting method according claim 1, wherein, in dispensing the thermosetting resin onto the reinforcement position, only the first electrode adjacent to the reinforcement position is coated with the thermosetting resin.

5. The electronic component mounting method according to claim 1, wherein the thermosetting resin contains a component that acts to remove an oxide present on surfaces of the first electrodes and/or the bumps.

6. The electronic component mounting method according to claim 1, wherein the flux applied to the plurality of bumps is the same material as the flux applied to the at least one of the first electrodes, and the flux is a thermosetting flux.

7. The electronic component mounting method according to claim 1, wherein the principal surface of the first electronic component is rectangular, and the thermosetting resin is dispensed onto the reinforcement positions corresponding to at least four corners, or vicinities of the four corners, of the first electronic component.

8. The electronic component mounting method according to claim 1, the method further comprising the steps of:
    providing a second electronic component having a connection terminal;
    before applying the flux to the first electrode, applying a paste containing metal particles by screen printing to a second electrode provided on the substrate, the second electrode corresponding to the connection terminal; and
    placing the second electronic component on the substrate such that the connection terminal lands on the second electrode via the paste containing metal particles.

* * * * *